US012114553B2

(12) United States Patent
Yun et al.

(10) Patent No.: US 12,114,553 B2
(45) Date of Patent: Oct. 8, 2024

(54) DISPLAY DEVICE AND METHOD FOR PROCESSING IMAGE SIGNAL THEREOF

(71) Applicant: Samsung Display Co., Ltd., Yongin-si (KR)

(72) Inventors: Youngnam Yun, Yongin-si (KR); Kyuseok Kim, Yongin-si (KR); Heejin Jang, Yongin-si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 811 days.

(21) Appl. No.: 17/149,153

(22) Filed: Jan. 14, 2021

(65) Prior Publication Data

US 2021/0265431 A1    Aug. 26, 2021

(30) Foreign Application Priority Data

Feb. 21, 2020  (KR) .................... 10-2020-0021762

(51) Int. Cl.
*H10K 59/65*     (2023.01)
*H04N 23/54*     (2023.01)
*H04N 23/55*     (2023.01)
*H10K 59/35*     (2023.01)

(52) U.S. Cl.
CPC .......... *H10K 59/353* (2023.02); *H04N 23/54* (2023.01); *H04N 23/55* (2023.01); *H10K 59/65* (2023.02)

(58) Field of Classification Search
CPC ................... H10K 59/351–353; H10K 59/126
See application file for complete search history.

(56) References Cited

U.S. PATENT DOCUMENTS

| 9,648,216 | B2 | 5/2017 | Yoo et al. |
| 10,009,525 | B2 | 6/2018 | Mathew et al. |
| 2007/0040849 | A1* | 2/2007 | Jeffrey .................. G09G 5/363 |
| | | | 345/629 |

(Continued)

FOREIGN PATENT DOCUMENTS

| CN | 109148365 | 1/2019 |
| CN | 109639897 | 4/2019 |

(Continued)

OTHER PUBLICATIONS

Sangmin Lee, "Extreme Darity a7R III", Video Digital Camera Magazine (Monthly VDCM), Aug. 10, 2018, http://www.vdcm.co.kr/news/articlePrint.html?idxno=5130, with English translation.

*Primary Examiner* — Eric K Ashbahian
(74) *Attorney, Agent, or Firm* — KILE PARK REED & HOUTTEMAN PLLC

(57) ABSTRACT

A display device includes a main display area, a component area including a transmission area, main sub-pixels disposed on a substrate corresponding to a main display area, and auxiliary sub-pixels disposed on the substrate corresponding to the component area. The component area includes a first component area and a second component area. Auxiliary sub-pixels arranged in the first component area and auxiliary sub-pixels arranged in the second component area have a same arrangement structure. An opaque layer is disposed between the substrate and the auxiliary sub-pixels in the second component area and includes a hole corresponding to the transmission area.

18 Claims, 32 Drawing Sheets

(56) References Cited

U.S. PATENT DOCUMENTS

| | | | |
|---|---|---|---|
| 2007/0223900 A1* | 9/2007 | Kobayashi | H04N 5/2621 |
| | | | 396/50 |
| 2007/0291325 A1 | 12/2007 | Toyota et al. | |
| 2009/0002513 A1* | 1/2009 | Yoshida | H04N 25/583 |
| | | | 348/222.1 |
| 2012/0074435 A1* | 3/2012 | Ha | H10K 59/128 |
| | | | 257/E33.012 |
| 2012/0105400 A1 | 5/2012 | Mathew et al. | |
| 2017/0179424 A1* | 6/2017 | Lee | H10K 71/00 |
| 2017/0256747 A1 | 9/2017 | Lee et al. | |
| 2019/0206953 A1* | 7/2019 | Hsieh | G09G 3/2074 |
| 2019/0267438 A1* | 8/2019 | Goto | H10K 50/125 |
| 2019/0373166 A1* | 12/2019 | Jia | G09G 3/2003 |
| 2021/0020664 A1* | 1/2021 | Tan | G06F 1/1605 |
| 2021/0366933 A1* | 11/2021 | Zhang | G06V 40/1318 |

FOREIGN PATENT DOCUMENTS

| | | |
|---|---|---|
| JP | 4759511 | 8/2011 |
| JP | 2012-98726 | 5/2012 |
| KR | 10-2014-0125029 | 10/2014 |
| KR | 10-1763386 | 8/2017 |
| KR | 10-2017-0104097 | 9/2017 |
| KR | 10-2017-0132495 | 12/2017 |
| KR | 10-2019-0018334 | 2/2019 |

\* cited by examiner

DISPLAY DEVICE AND METHOD FOR PROCESSING IMAGE SIGNAL THEREOF

CROSS-REFERENCE TO RELATED APPLICATION(S)

This application claims priority to and benefits of Korean Patent Application No. 10-2020-0021762 under 35 U.S.C. § 119, filed in the Korean Intellectual Property Office on Feb. 21, 2020, the entire contents of which is incorporated herein by reference.

BACKGROUND

1. Technical Field

The disclosure relates to a display panel of which a display area is expanded for displaying of images even in an area where an electronic component is located, and a display device including the display panel.

2. Description of the Related Art

Recently, display devices have been used in various fields. Also, as the thickness and weight of display devices have been reduced, the range of use of the display devices has widened.

As the display devices are variously used, different methods may be used to design types of the display devices. Also, functions embedded onto or linked with the display devices continue to increase.

SUMMARY

One or more embodiments of the disclosure may provide a display panel of which a display area may be expanded to display images in an area where a component that is an electronic element may be located, and a display device including the display panel. However, this is merely an example, and one or more embodiments of the disclosure are not limited thereto.

Additional aspects will be set forth in part in the description which follows and, in part, will be apparent from the description, or may be learned by practice of the presented embodiments of the disclosure.

According to one or more embodiments of the disclosure, a display device may include a main display area, a component area including a transmission area, main sub-pixels disposed on a substrate corresponding to the main display area, and auxiliary sub-pixels disposed on the substrate corresponding to the component area. The component area may include a first component area and a second component area. Auxiliary sub-pixels arranged in the first component area and auxiliary sub-pixels arranged in the second component area may have a same arrangement structure. An opaque layer may be disposed between the substrate and the auxiliary sub-pixels in the second component area. The opaque layer may include a hole corresponding to the transmission area.

The hole of the opaque layer may have a circle shape.

The opaque layer may include lightproof metal.

The opaque layer may include a lightproof organic material.

The display device may further include a first camera disposed under the substrate corresponding to the first component area, a second camera disposed under the substrate corresponding to the second component area, and a driver that generates a synthesis image signal by synthesizing a first image signal from the first camera and a second image signal from the second camera.

The first camera may include a low-sensitivity camera having a high resolution, and the second camera may include a high-sensitivity camera having a low resolution.

The driver may generate the synthesis image signal by replacing deterioration data of the first image signal with pixel data of a corresponding location in the second image signal.

The driver may generate the synthesis image signal by synthesizing pixel data corresponding to a front scene of the first image signal and pixel data corresponding to a background of the second image signal.

The driver may generate the first image signal by synthesizing a plurality of image signals obtained by moving an image sensor of the first camera by as much as a pixel pitch in multiple directions, and generate the second image signal by synthesizing a plurality of image signals obtained by moving an image sensor of the second camera by as much as a pixel pitch in multiple directions.

The display device may further include a camera disposed under the substrate corresponding to the component area, and a driver that may generate a synthesis image signal by synthesizing a first image signal which is obtained by moving the camera towards the first component area and a second image signal which is obtained by moving the camera towards the second component area.

The driver may generate the synthesis image signal by replacing deterioration data of the first image signal with pixel data of a corresponding location in the second image signal.

The driver may generate the synthesis image signal by synthesizing pixel data corresponding to a front scene of the first image signal and pixel data corresponding to a background of the second image signal.

The driver may generate the first image signal by synthesizing a plurality of image signals obtained by moving an image sensor of the camera by as much as a pixel pitch in multiple directions, and generate the second image signal by synthesizing a plurality of image signals obtained by moving the image sensor of the camera by as much as a pixel pitch in multiple directions.

Pixel groups may be disposed in the component area, each of the pixel groups may include a predetermined number of the auxiliary sub-pixels, and the transmission area may be located around the pixel groups.

Each of the main sub-pixels and the auxiliary sub-pixels may include a pixel electrode and an emission layer, and an opposite electrode may be disposed above the pixel electrode. The opposite electrode may be common to the main sub-pixels and the auxiliary sub-pixels and include a through hole corresponding to the transmission area.

According to one or more embodiments of the disclosure, an image signal processing method of a display device including a main display area, a first component area, and a second component area may include obtaining a first image signal from light-receiving pixels of an image sensor disposed corresponding to the first component area of the display device, obtaining a second image signal from light-receiving pixels of an image sensor disposed corresponding to the second component area of the display device, and generating a synthesis image signal by synthesizing the first image signal and the second image signal.

The obtaining of the first image signal may include obtaining an image signal from a first camera including light-receiving pixels disposed corresponding to the first component area, and the obtaining of the second image signal may include obtaining an image signal from a second camera including light-receiving pixels disposed corresponding to the second component area.

The obtaining of the second image signal may include moving a camera including light-receiving pixels disposed corresponding to the first component area to the second component area.

The generating of the synthesis image signal may include replacing deterioration data of the first image signal with pixel data of a corresponding location in the second image signal.

The generating of the synthesis image signal may include synthesizing pixel data corresponding to a foreground of the first image signal and pixel data corresponding to a background of the second image signal.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION OF THE EMBODIMENTS

Figure 1A:
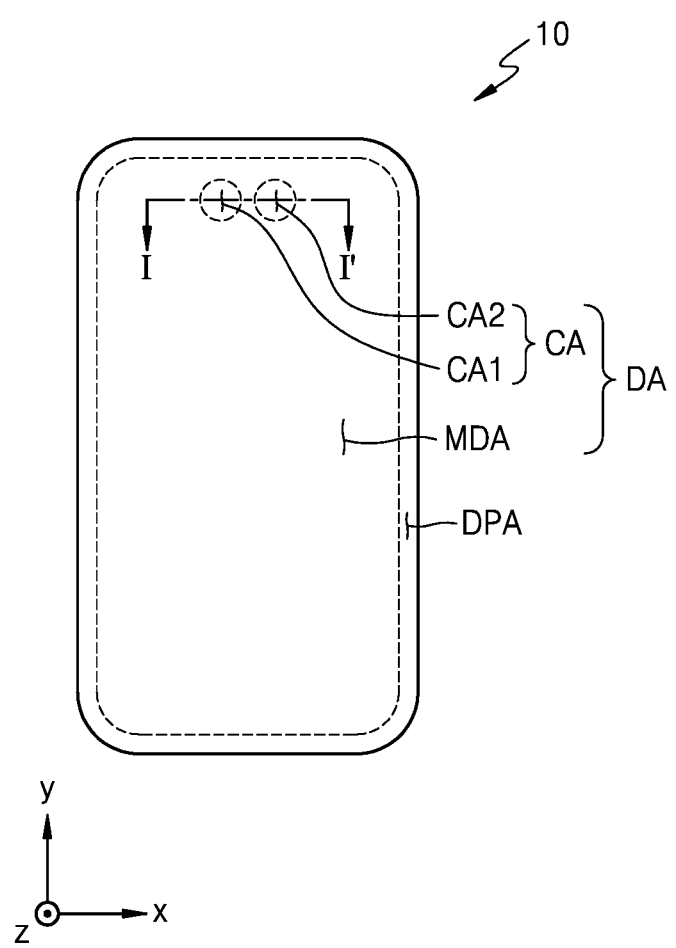
FIGS. 1A to 1C are schematic plan views of a display panel, according to an embodiment.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects of the description. As used herein, the term "and/or" includes any and all combinations of one or more of the associated listed items. The terms "and" and "or" may be used in the conjunctive or disjunctive sense and may be understood to be equivalent to "and/or." Throughout the disclosure, the expression "at least one of a, b or c" indicates only a, only b, only c, both a and b, both a and c, both b and c, all of a, b, and c, or variations thereof.

It will be understood that although the terms "first," "second," etc. may be used herein to describe various elements, these elements should not be limited by these terms. These terms are only used to distinguish one element from another.

As used herein, the singular forms "a," "an" and "the" are intended to include the plural forms as well, unless the context clearly indicates otherwise.

It will be further understood that the terms such as "comprises", "comprising", "has", "have", "having", "includes", and "including" as used herein specify the presence of stated features or elements, but do not preclude the presence or addition of one or more other features or elements.

It will be understood that when a layer, region, or element is referred to as being "formed on" another layer, region, or element, it can be directly or indirectly formed on the other layer, region, or element. For example, intervening layers, regions, or elements may be present.

Sizes of elements in the drawings may be exaggerated for convenience of explanation. In other words, because sizes and thicknesses of elements in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

It will be understood that when an element, such as a layer, a film, a region, or a plate, is referred to as being "connected to" another element, the element can be directly on the other element or intervening elements may be present therebetween. For example, it will be understood that when an element, such as a layer, a film, a region, or a plate, is referred to as being "electrically connected to" another element, the element can be electrically directly on the other element or intervening elements may be present therebetween for an indirect electrical connection.

The term overlap may include layer, stack, face or facing, extending over, extending under, covering or partly covering or any other suitable term as would be appreciated and understood by those of ordinary skill in the art. The expression "not overlap" may include apart from or set aside from or offset from and any other suitable equivalents as would be appreciated and understood by those of ordinary skill in the art.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within +30%, 20%, 5% of the stated value.

Unless otherwise defined, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

Figure 1B:
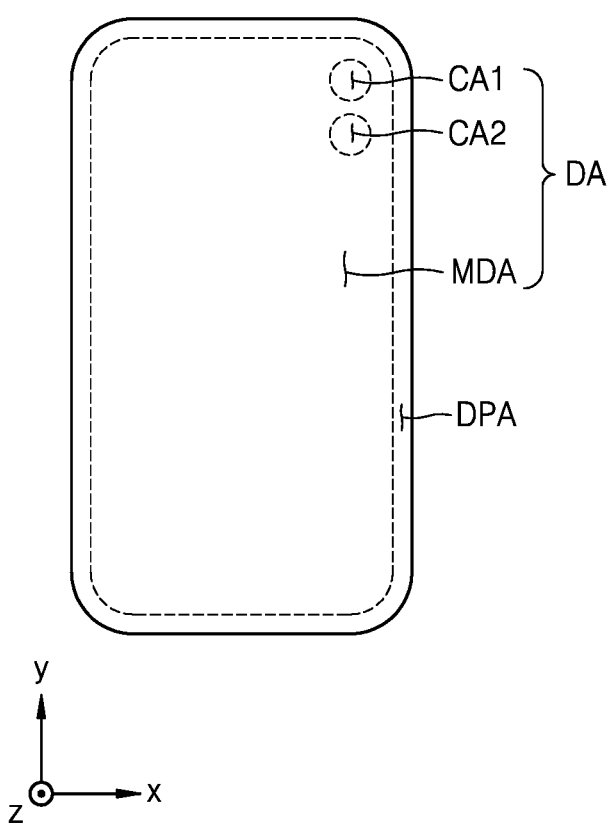
Figure 1C:
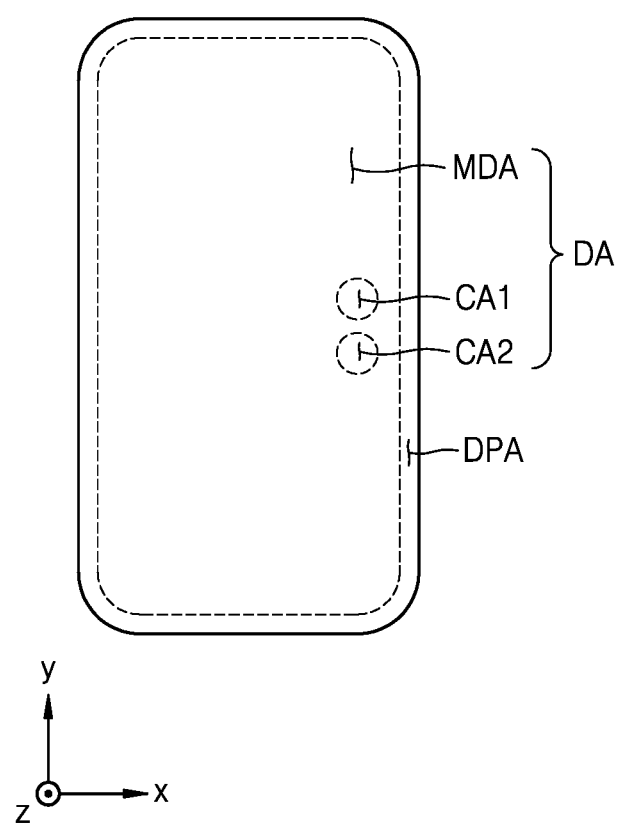

FIGS. 1A to 1C are schematic plan views of a display panel, according to an embodiment.

A display panel 10 may be a light-emitting display panel including a light-emitting element. For example, the display panel 10 may be an organic light-emitting display panel using organic light-emitting diodes (OLEDs) including organic emission layers, a micro LED display panel using micro LEDs, a quantum dot light-emitting display panel using quantum dot light-emitting diodes including quantum dot emission layers, or an inorganic light-emitting display panel using an inorganic light-emitting element including an inorganic semiconductor.

The display panel 10 may be a rigid display panel that is difficult if not impossible to be bent due to its rigidity, or a flexible display panel that may be easily bent, folded, or rolled due to its flexibility. For example, the display panel 10 may be a foldable display panel that may be folded and unfolded, a display panel including a curved display surface, a bendable display panel in which regions, other than the display surface, are curved, a rollable display panel that may be rolled or unrolled, or a stretchable display panel.

Referring to FIGS. 1A to 1C, the display panel 10 may include a display area DA, where images may be represented, and a peripheral area DPA, where images may not be displayed. The display area DA may include a main display area MDA and a component area CA. The main display area MDA and the component area CA may be areas where images are displayed, and the component area CA may be an area where a component 40, for example, a sensor using visible rays, infrared rays, sound, or the like, a camera, etc., is disposed. In an embodiment, the component area CA may be an area having greater light transmittance and/or sound transmittance than the main display area MDA. In an embodiment, when light passes through the component area CA, the light transmittance may be equal to or greater than about 25%, about 30%, about 50%, about 75%, about 80%, about 85%, or about 90%.

The component area CA may be disposed inside the main display area MDA and surrounded by the same. Also, a shape of the component area CA may be a circle, and the component area CA may be provided in the singular or plural. Referring to FIGS. 1A to 1C, two component areas CA1 and CA2 are shown.

As shown in FIG. 1A, the component area CA may include a first component area CA1 and a second component area CA2, which are arranged side-by-side in an x direction. As another example, as shown in FIGS. 1B and 1C, the component area CA may include the first component area CA1 and the second component area CA2, which are arranged side-by-side in a y direction. The first component area CA1 and the second component area CA2 may be apart from each other and may each be surrounded by the main display area MDA. A first component may be disposed corresponding to the first component area CA1, and a second component may be disposed corresponding to the second component area CA2. In another embodiment, there may be three or more component areas CA, and a component corresponding to each component area CA may be disposed. In case that the components are cameras, because the cameras may be disposed respectively corresponding to the designated component areas CA, images may be captured at various angles, and image compensation may be performed based on the images.

FIGS. 1A to 1C show that the component area CA of the display area DA may have a circular shape. However, one or more embodiments are not limited thereto. For example, the shape of the component area CA may be an oval or a polygon such as a triangle or a pentagon, and a location and a size of the component area CA may vary.

Figure 2A:
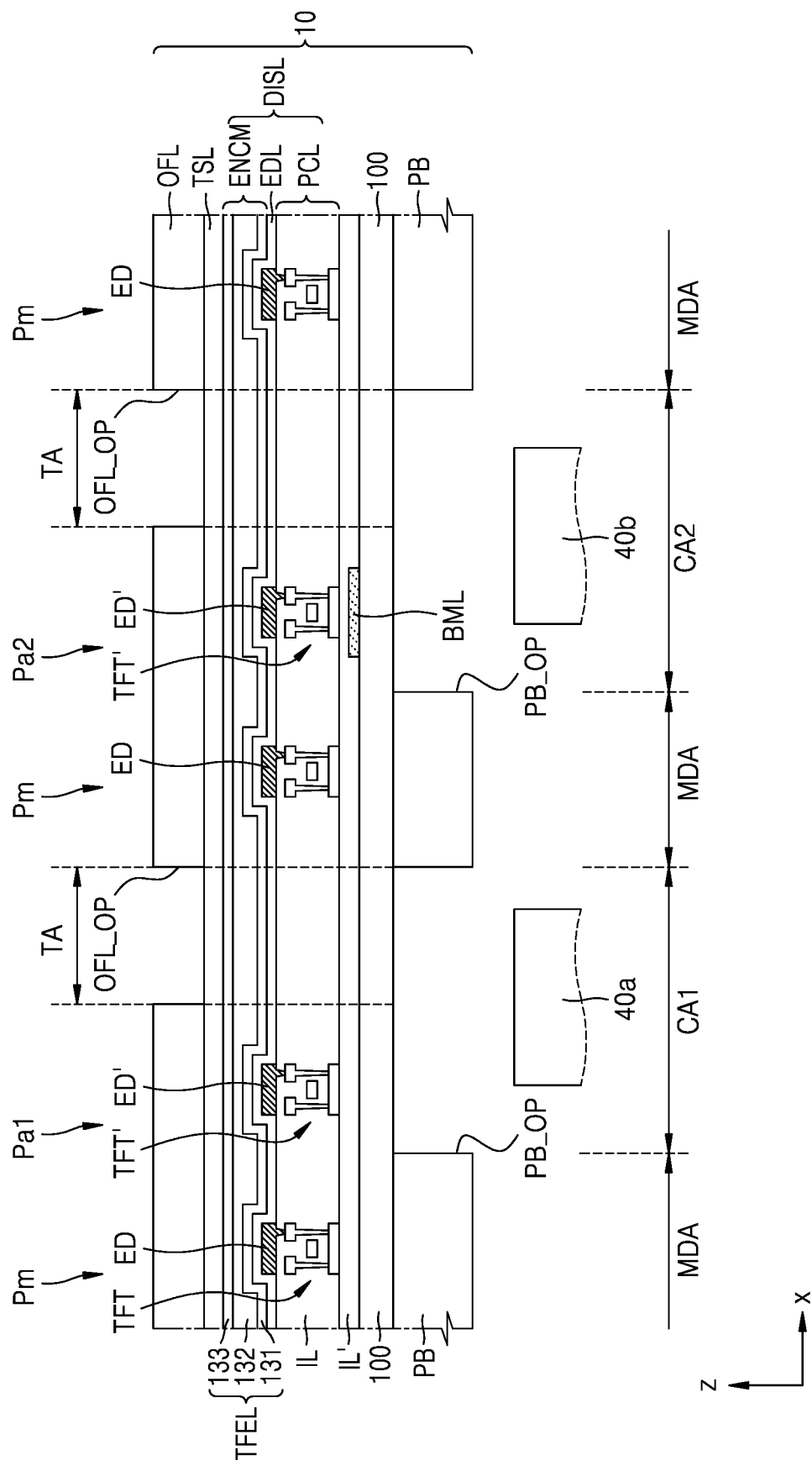
FIGS. 2A and 2B are schematic cross-sectional views of a display panel, according to embodiments.
Figure 2B:
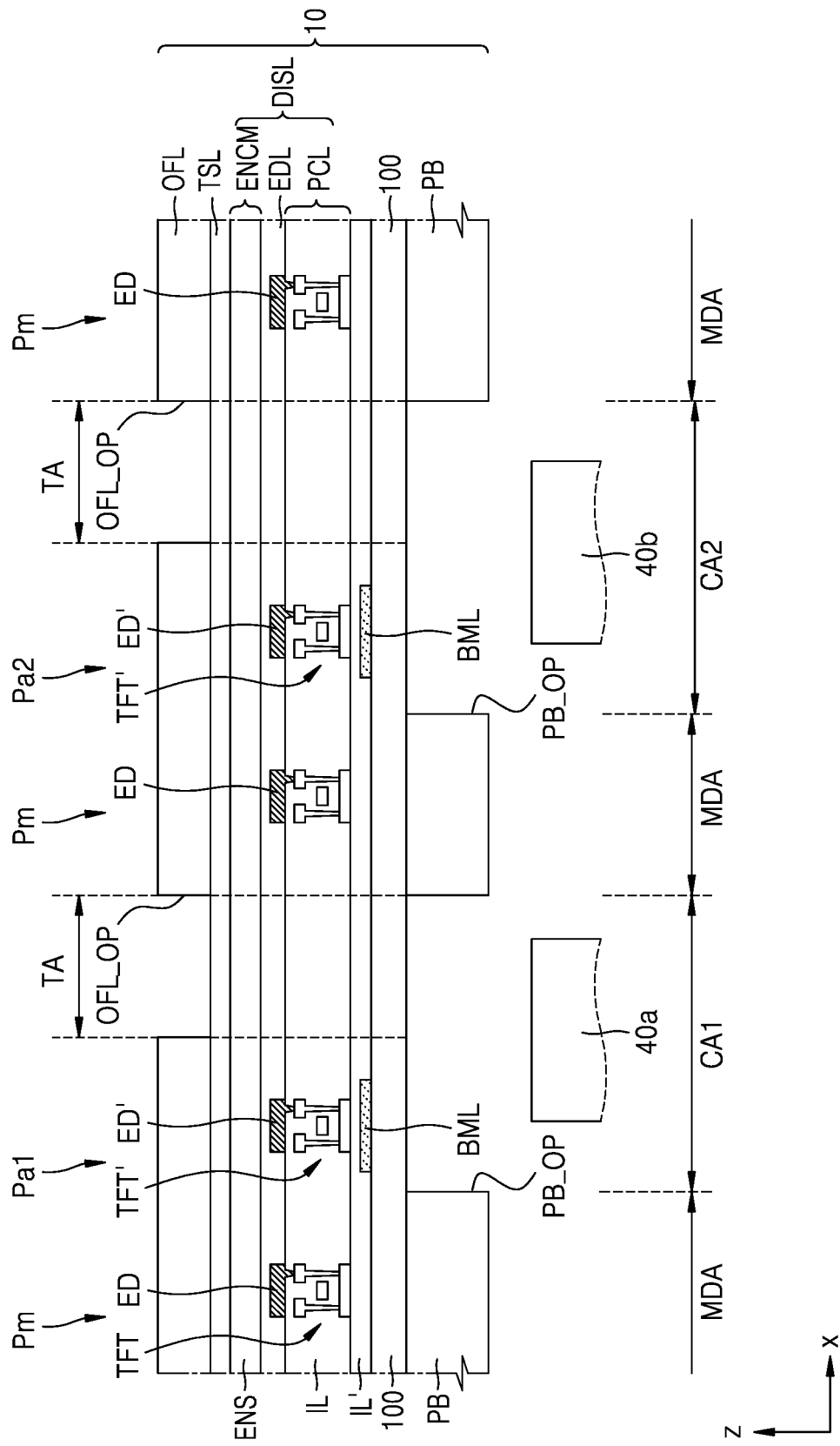

FIGS. 2A and 2B are schematic cross-sectional views of a display panel, according to embodiments and may correspond to a cross-section of the display panel 10 taken along line I-I' of FIG. 1A.

Referring to FIG. 2A, a display device may include the display panel 10 including a display element and a first component 40a and a second component 40b that may overlap the display panel 10. The display panel 10 may include the first component area CA1 overlapping the first component 40a, the second component area CA2 overlapping the second component 40b, and the main display area MDA where a main image may be displayed.

The display panel 10 may include a substrate 100, a display layer DISL on the substrate 100, a touch screen layer TSL, an optical functional layer OFL, and a panel protection member PB under the substrate 100. The display layer DISL may include a circuit layer PCL including thin film transistors TFT and TFT', a display element layer EDL including light-emitting elements ED and ED' that are display elements, and an encapsulation member ENCM such as a thin film encapsulation layer TFEL or an encapsulation substrate ENS. Between the substrate 100 and the display layer DISL and in the display layer DISL, insulating layers IL and IL' may be disposed.

As described above, the substrate 100 may include an insulating material such as glass, quartz, polymer resin, or a combination thereof. The substrate 100 may be a rigid substrate, a flexible substrate that is bendable, foldable, or rollable, or a combination thereof.

Main sub-pixels Pm including main light-emitting elements ED and main thin film transistors TFT connected to the main light-emitting elements ED may be disposed in the main display area MDA of the display panel 10, and auxiliary sub-pixels Pa1 and Pa2 (also referred to as Pa) including auxiliary light-emitting elements ED' and auxiliary thin film transistors TFT' connected to the auxiliary light-emitting elements ED' may be disposed in the first and second component areas CA1 and CA2.

Also, in the first and second component areas CA1 and CA2, there may be transmission areas TA where no display elements are located. The transmission areas TA may be areas where light/signals emitted from the first and second components 40a and 40b, which are disposed corresponding to the first and second component areas CA1 and CA2, or light/signals incident to the first and second components 40a and 40b are transmitted.

In the first component area CA1 or the second component area CA2, an opaque layer BML may be disposed. Referring to FIG. 2A, the opaque layer BML is not disposed in the first component area CA1 but disposed in the second component area CA2. The opaque layer BML may be disposed corresponding to the bottom of the auxiliary thin film transistor TFT'. For example, the opaque layer BML may be disposed between the auxiliary thin film transistor TFT' and the substrate 100. The opaque layer BML may prevent external light from reaching the auxiliary thin film transistor TFT'. In the second component area CA2, the opaque layer BML may be provided in plural. In the second component area CA2, there may be one opaque layer BML including a hole corresponding to the transmission area TA.

As shown in FIG. 2A, the display element layer EDL may be covered by the thin film encapsulation layer TFEL, or as shown in FIG. 2B, the display element layer EDL may be covered by the encapsulation substrate ENS.

In some embodiments, the thin film encapsulation layer TFEL may include at least one inorganic encapsulation layer and at least one organic encapsulation layer. In an embodiment, the thin film encapsulation layer TFEL may include first and second inorganic encapsulation layers 131 and 133 and an organic encapsulation layer 132 therebetween.

In some embodiments, the encapsulation substrate ENS may face the substrate 100 with the display element layer EDL therebetween. A gap may be disposed between the encapsulation substrate ENS and the display element layer EDL. The encapsulation substrate ENS may include glass. A sealant such as frit may be disposed between the substrate 100 and the encapsulation substrate ENS, and the sealant may be disposed in the aforementioned peripheral area DPA. The sealant in the peripheral area DPA may surround the display area DA and prevent the penetration of moisture through a side surface of the display panel 10.

The touch screen layer TSL may obtain coordinate information according to an external input, for example, a touch event. The touch screen layer TSL may include a touch electrode and trace lines connected to the touch electrode. The touch screen layer TSL may detect external inputs in a self-capacitance manner or a mutual capacitance manner.

The touch screen layer TSL may be formed on the thin film encapsulation layer TFEL or the encapsulation substrate ENS. As another example, the touch screen layer TSL formed on a separate touch substrate may be coupled to the thin film encapsulation layer TFEL or the encapsulation substrate ENS by an adhesive layer such as an optical clear adhesive (OCA). In an embodiment, as shown in FIGS. 2A and 2B, the touch screen layer TSL may be formed (e.g., directly formed) on the thin film encapsulation layer TFEL or the encapsulation substrate ENS, and an adhesive layer may not be disposed between the touch screen layer TSL and the thin film encapsulation layer TFEL or between the touch screen layer TSL and the encapsulation substrate ENS.

The optical functional layer OFL may include a reflection prevention layer. The reflection prevention layer may decrease the reflectivity of light (external light) that is incident to the display panel 10 from the outside.

In some embodiments, the optical functional layer OFL may be a polarization film. The optical functional layer OFL may include an opening OFL_OP corresponding to the transmission area TA. Accordingly, the light transmittance of the transmission area TA may be significantly improved. The opening OFL_OP may be filled with a transparent material such as optically clear resin (OCR). In other embodiments, the optical functional layer OFL may include a black matrix and color filters. In the transmission area TA, no color filters and no black matrix may be located. For example, a layer including the color filters and the black matrix may include a hole corresponding to the transmission area TA.

The panel protection member PB may include an opening PB_OP corresponding to the transmission area TA.

Figure 3:
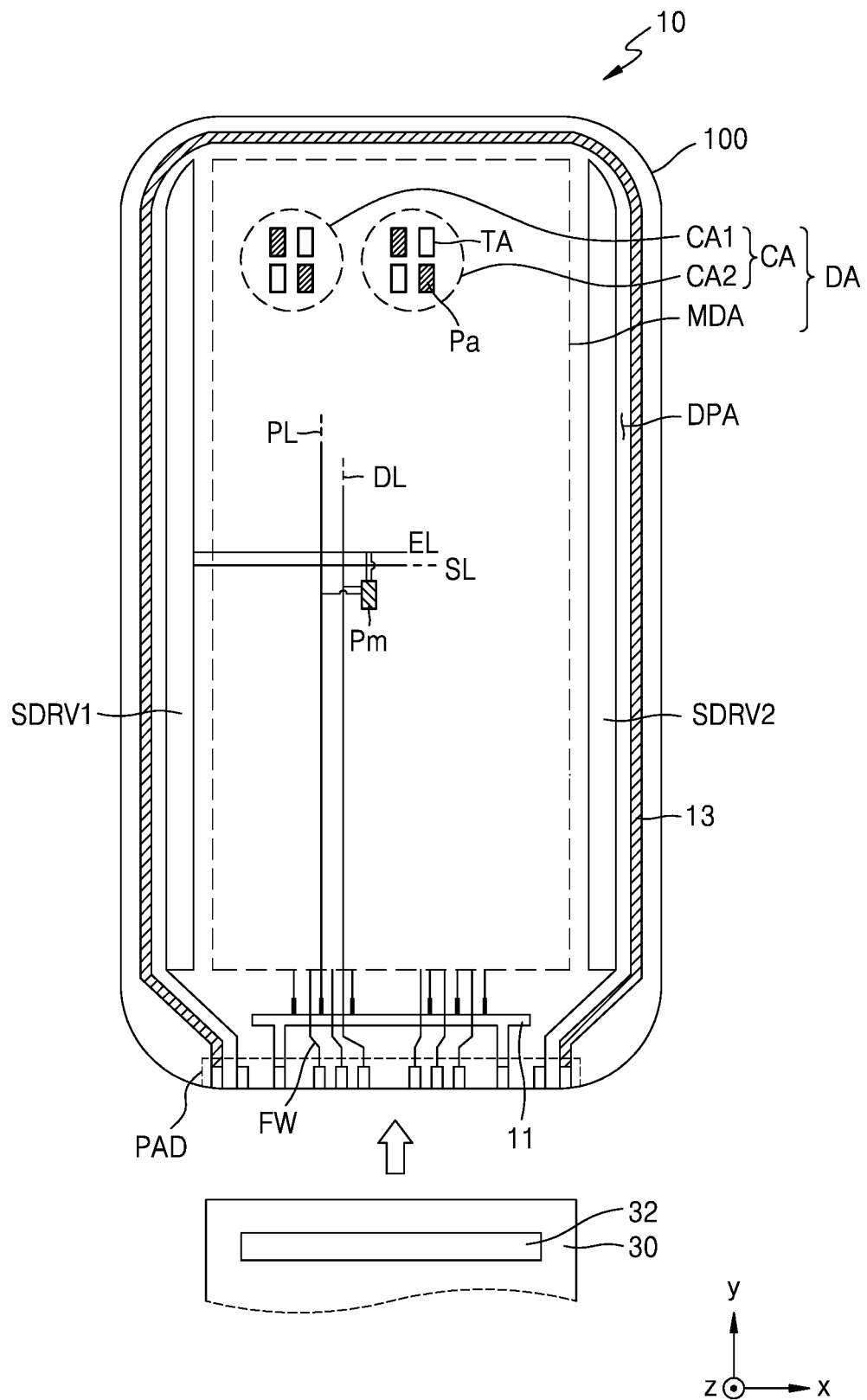
FIG. 3 is a schematic plan view of a display panel according to an embodiment.

FIG. 3 is a schematic plan view of a display panel according to an embodiment.

Referring to FIG. 3, various components forming the display panel 10 may be disposed on the substrate 100. The substrate 100 may include the display area DA and the peripheral area DPA surrounding the display area DA. The display area DA may include the main display area MDA, where a main image may be displayed, and the component area CA, which may include the transmission area TA and where a peripheral image may be displayed. The component area CA may include the first and second component areas CA1 and CA2 that may be apart from each other. The peripheral image may produce a whole image with the main image and may be independent from the main image.

In the main display area MDA, main sub-pixels Pm may be arranged. Each main sub-pixel Pm may be realized as a display element such as an organic light-emitting diode OLED. Each main sub-pixel Pm may emit, for example, red light, green light, blue light, or white light. The main display area MDA may be covered by an encapsulation member and thus may be protected from external air, moisture, or the like.

The first and second component areas CA1 and CA2 may be disposed inside the display area DA and surrounded by the main display area MDA. In the first and second component areas CA1 and CA2, the auxiliary sub-pixels Pa may be arranged. Each auxiliary sub-pixel Pa may be realized by the display element such as the organic light-emitting diode OLED. Each auxiliary sub-pixel Pa may emit, for example, red light, green light, blue light, or white light. The first and second component areas CA1 and CA2 may be covered by an encapsulation member and thus may be protected from external air, moisture, or the like.

The first and second component areas CA1 and CA2 may each include the transmission area TA. The transmission area TA may surround the auxiliary sub-pixels Pa. As another example, the transmission area TA and the auxiliary sub-pixels Pa may be located in a lattice form.

Because the first and second component areas CA1 and CA2 may include the transmission areas TA, a resolution of each of the first and second component areas CA1 and CA2 may be lower than that of the main display area MDA. For example, the resolution of each of the first and second component areas CA1 and CA2 may be about ½, about ⅜, about ⅓, about ¼, about ⅖, about ⅛, about ⅑, about 1/16, or the like the resolution of the main display area MDA. For example, the resolution of the main display area MDA may be about 400 ppi, and the resolution of each of the first and second component areas CA1 and CA2 may be about 200 ppi or about 100 ppi.

Pixel circuits driving the main and auxiliary sub-pixels Pm and Pa may be electrically connected to outer circuits disposed in the peripheral area DPA, respectively. In the peripheral area DPA, a first scan driving circuit SDRV1, a second scan driving circuit SDRV2, a terminal PAD, a driving voltage supply line 11, and a common voltage supply line 13 may be disposed.

The first scan driving circuit SDRV1 may respectively transmit scan signals to the pixel circuits driving the main and auxiliary sub-pixels Pm and Pa through scan lines SL, respectively. The first scan driving circuit SDRV1 may transmit emission control signals to respective pixel circuits through emission control lines EL. The second scan driving circuit SDRV2 may be disposed opposite to the first scan driving circuit SDRV1 with respect to the main display area MDA and may be roughly parallel to the first scan driving circuit SDRV1. Some of the pixel circuits of the main sub-pixels Pm of the main display area MDA may be electrically connected to the first scan driving circuit SDRV1, and others thereof may be electrically connected to the second scan driving circuit SDRV2. Some of the pixel circuits of the auxiliary sub-pixels Pa of the first and second component areas CA1 and CA2 may be electrically connected to the first scan driving circuit SDRV1, and others thereof may be electrically connected to the second scan driving circuit SDRV2. In an embodiment, the second scan driving circuit SDRV2 may not be formed.

The terminal PAD may be on one side of the substrate 100. The terminal PAD may not be covered by an insulating layer and exposed to the outside, thus being electrically connected to a display circuit board 30. On the display circuit board 30, a display driver 32 may be disposed. The display driver 32 may generate control signals transmitted to the first and second scan driving circuits SDRV1 and SDRV2. Also, the display driver 32 may supply a driving voltage ELVDD to the driving voltage supply line 11 and a common voltage ELVSS to the common voltage supply line 13. The driving voltage ELVDD may be applied to the pixel circuits of the main and auxiliary sub-pixels Pm and Pa through a driving power line PL electrically connected to the driving voltage supply line 11, and the common voltage ELVSS may be applied to an opposite electrode of the display element through the common voltage supply line 13. The display driver 32 may generate data signals, and the generated data signals may be transmitted to the pixel circuits of the main and auxiliary sub-pixels Pm and Pa through fanout wire FW and data lines DL electrically connected to the fanout wire FW.

The driving voltage supply line 11 may extend in an x direction at the bottom of the main display area MDA. The common voltage supply line 13 may have a loop shape of which one side is open and thus may partially surround the main display area MDA.

Figure 4A:
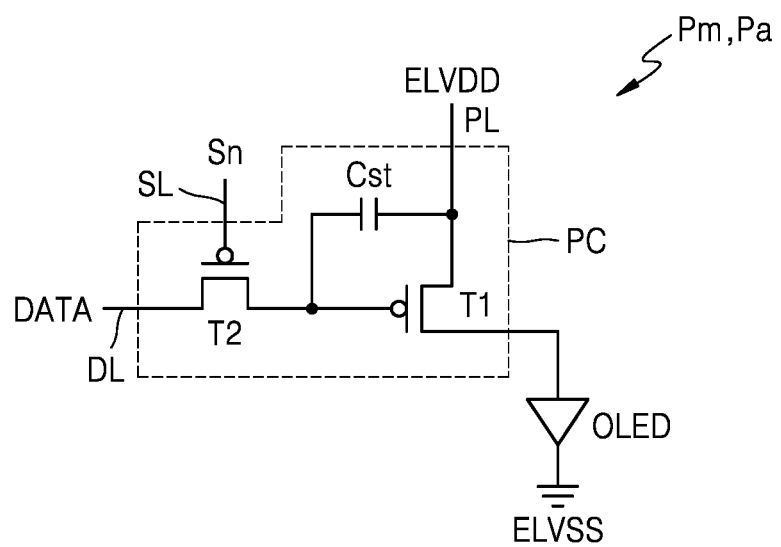
FIGS. 4A and 4B are schematic circuit diagrams of sub-pixels of a first pixel and/or a second pixel which may be included in the display panel, according to an embodiment.
Figure 4B:
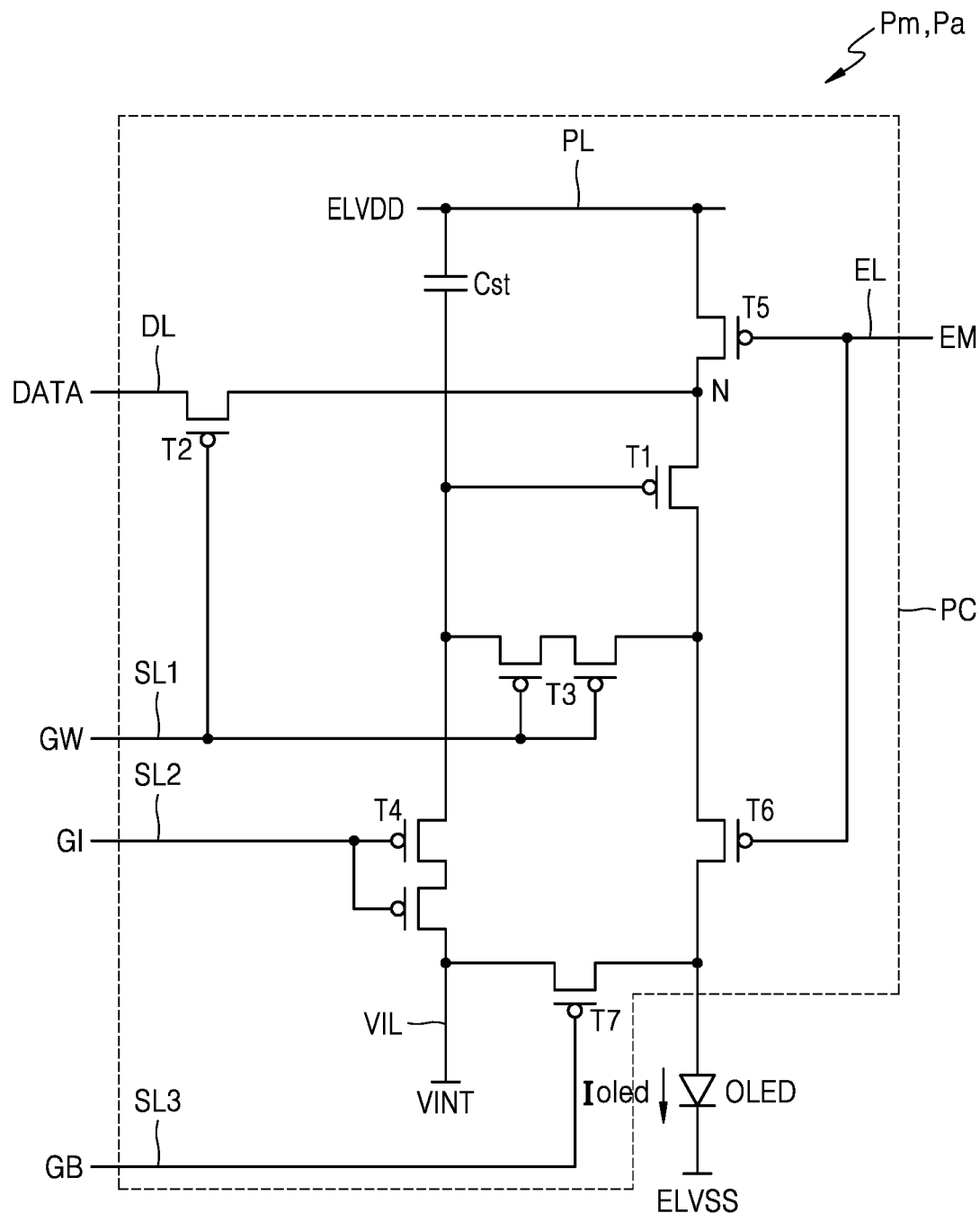

FIGS. 4A and 4B are schematic circuit diagrams of sub-pixels of a first pixel and/or a second pixel which may be included in the display panel, according to an embodiment.

Referring to FIG. 4A, the main and auxiliary sub-pixels Pm and Pa may each include the organic light-emitting diode OLED. The organic light-emitting diode OLED may be electrically connected to a pixel circuit PC electrically connected to a scan line SL and a data line DL. The pixel circuit PC may include a first transistor T1, a second transistor T2, and a capacitor Cst. The first transistor T1 and the second transistor T2 may include thin film transistors.

The second transistor T2 may be electrically connected to the scan line SL and the data line DL as a switching transistor and transmit a data signal DATA, which is input through the data line DL, to the first transistor T1 in response to the scan signal Sn input through the scan line SL.

The capacitor Cst may be electrically connected to the second transistor T2 and the driving power line PL and store a voltage corresponding to a difference between a voltage from the second transistor T2 and the driving voltage ELVDD applied to the driving power line PL.

The first transistor T1 may be electrically connected to the driving power line PL and the capacitor Cst as a driving transistor, and may control a driving current flowing from the driving power line PL to the organic light-emitting diode OLED from the driving power line PL, corresponding to a value of the voltage stored in the capacitor Cst. The organic light-emitting diode OLED may emit light having certain brightness according to a driving current. The common voltage ELVSS may be applied to an opposite electrode (e.g., a cathode) of the organic light-emitting diode OLED.

Referring to FIG. 4A, the pixel circuit PC may include two transistors and one capacitor, but one or more embodiments are not limited thereto. As shown in FIG. 4B, the pixel circuit PC may include seven transistors and one capacitor.

Referring to FIG. 4B, the pixel circuit PC may include first to seventh transistors T1 to T7, and the first to seventh transistors T1 to T7 may include thin film transistors.

The pixel circuit PC may be electrically connected to a first scan line SL1 transmitting a first scan signal GW, a second scan line SL2 transmitting a second scan signal GI, a third scan line SL3 transmitting a third scan signal GB, an emission control line EL transmitting an emission control signal EM, and a data line DL transmitting a data signal DATA.

The driving power line PL may transmit the driving voltage ELVDD to the first transistor T1, and an initialization voltage line VIL may transmit an initialization voltage VINT, which initializes the first transistor T1 and the organic light-emitting diode OLED, to a gate electrode of the first transistor T1 and the organic light-emitting diode OLED.

In one embodiment, the first scan line SL1, the second scan line SL2, the third scan line SL3, the emission control line EL, and the initialization voltage line VIL may extend in the x direction and may be separate from one another in each row. The data line DL and the driving power line PL may extend in the y direction and may be separate from one another in each column.

Returning to FIG. 4B, the first transistor T1 may be electrically connected to the driving power line PL via the fifth transistor T5 and electrically connected to the organic light-emitting diode OLED via the sixth transistor T6. As the driving transistor, the first transistor T1 may receive the data signal DATA according to a switching operation of the second transistor T2 and supply a driving current Ioled to the organic light-emitting diode OLED.

The second transistor T2 may be electrically connected to the first scan line SL1 and the data line DL and may be turned on in response to the first scan signal GW received via the first scan line SL1, thereby performing a switching operation of transmitting, to a node N, the data signal DATA transmitted through the data line DL.

The third transistor T3 may be electrically connected to the organic light-emitting diode OLED via the sixth transistor T6. The third transistor T3 may be turned on in response to the first scan signal GW transmitted via the first scan line SL1 and diode-connects the first transistor T1.

The fourth transistor T4 may be turned on in response to the second scan signal GI transmitted via the second scan line SL2 and transmit the initialization voltage VINT from the initialization voltage line VIL to the gate electrode of the first transistor T1, thereby initializing the gate voltage of the first transistor T1.

The fifth transistor T5 and the sixth transistor T6 may be simultaneously turned on in response to the emission control signal EM received via the emission control line EL and form a current path to allow the driving current Ioled to flow in a direction from the driving power line PL to the organic light-emitting diode OLED.

The seventh transistor T7 may be turned on in response to the third scan signal GB received through the third scan line SL3 and transmit the initialization voltage VINT, which is transmitted from the initialization voltage line VIL, to the organic light-emitting diode OLED, thereby initializing the organic light-emitting diode OLED. The seventh transistor T7 may not be formed.

The capacitor Cst may be electrically connected to the driving power line PL and the gate electrode of the first transistor T1 and store and maintain a voltage corresponding to a difference between voltages of both ends of the capacitor Cst, thereby maintaining a voltage applied to the gate electrode of the first transistor T1.

The organic light-emitting diode OLED may include a pixel electrode and the opposite electrode, and the common voltage ELVSS may be applied to the opposite electrode. The organic light-emitting diode OLED may receive the driving current Ioled from the first transistor T1, and thus, an image may be displayed.

As shown in FIG. 4B, the third transistor T3 and the fourth transistor T4 may have dual-gate electrodes. However, the third transistor T3 and the fourth transistor T4 may have one gate electrode.

In an embodiment, a main sub-pixel Pm and an auxiliary sub-pixel Pa may include the same pixel circuit PC. However, one or more embodiments are not limited thereto. The main sub-pixel Pm and the auxiliary sub-pixel Pa may include pixel circuits PC having different structures. Various modifications may be made. For example, the main sub-pixel Pm may employ the pixel circuit of FIG. 4B, and the auxiliary sub-pixel Pa may employ the pixel circuit of FIG. 4A.

Figure 5:
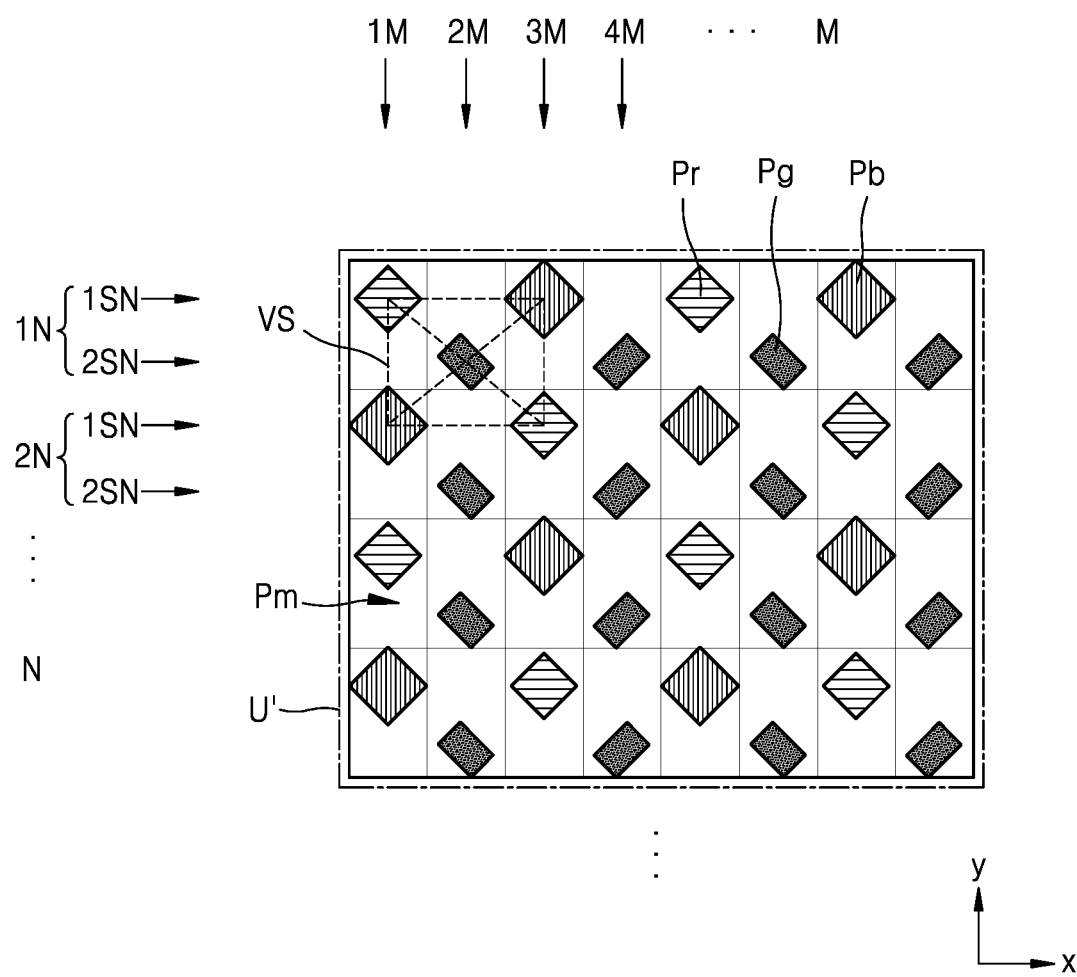
FIG. 5 is a plan view schematically showing a pixel arrangement structure in a main display area, according to an embodiment.

FIG. 5 is a plan view schematically showing a pixel arrangement structure in a main display area, according to an embodiment.

Referring to FIG. 5, the main sub-pixels Pm may be disposed in the main display area MDA. As used herein, a sub-pixel is a minimum unit used to represent an image and may be a display element including an organic light-emitting diode. An emission area of the sub-pixel may be defined by an opening of a pixel-defining layer. The emission area will be described below.

The main sub-pixels Pm may include a red sub-pixel Pr, a green sub-pixel Pg, and a blue sub-pixel Pb, and the red sub-pixel Pr, the green sub-pixel Pg, and the blue sub-pixel Pb may emit red light, green light, and blue light, respectively.

In a first sub-row 1SN of each row N (e.g., 1N, 2N), the red sub-pixels Pr and the blue sub-pixels Pb may be alternately arranged, the green sub-pixels Pg may be disposed apart from each other at certain intervals in an adjacent second sub-row 2SN, and such arrangements may be repeated to an $N^{th}$ row. The blue sub-pixels Pb and the red sub-pixels Pr may be greater than the green sub-pixels Pg. The red sub-pixels Pr and the blue sub-pixels Pb in the first sub-row 1SN may be arranged alternately with the green sub-pixels Pg in the second sub-row 2SN. Therefore, the red sub-pixels Pr and the blue sub-pixels Pb may be alternately arranged in a first column 1M, the green sub-pixels Pg may be apart from each other in an adjacent second column 2M, the blue sub-pixels Pb and the red sub-pixels Pr may be alternately arranged in an adjacent third column 3M, the green sub-pixels Pg may be apart from each other in an adjacent fourth column 4M, and such pixel arrangements may be repeated to an $M^{th}$ column.

As another way of expressing the pixel arrangement structure, the red sub-pixels Pr are arranged on first and third vertices, which face each other from among vertices of a virtual square VS having a central point of the green sub-pixel Pg as a central point of the virtual square VS, and the blue sub-pixels Pb are arranged on second and fourth vertices that are the remaining ones. The virtual square VS may be variously changed to, for example, a rectangle, a rhombus, a parallelogram, or the like.

Such pixel arrangement structures are referred to as a Pentile matrix structure or a Pentile structure, and by applying a rendering operation for expressing colors by sharing adjacent pixels, a high resolution may be achieved by a small number of pixels.

Referring to FIG. 5, the main sub-pixels Pm are arranged in a Pentile matrix form, but one or more embodiments are not limited thereto. For example, the main sub-pixels Pm may be arranged in various forms such as a stripe structure, a mosaic arrangement structure, and a delta arrangement structure.

Figure 6:
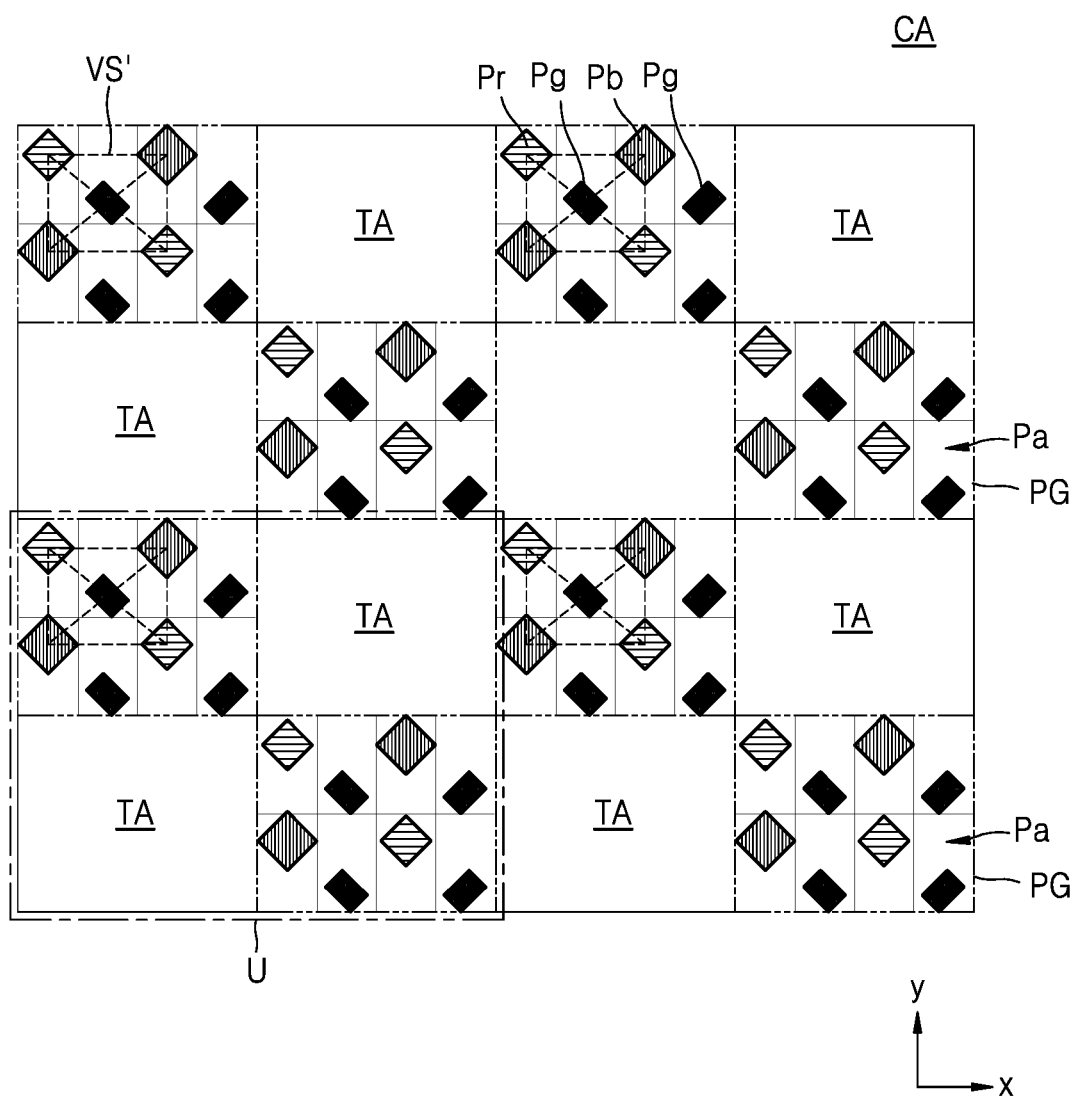
FIG. 6 is a plan view schematically showing a pixel arrangement structure in a component area, according to an embodiment.

FIG. 6 is a plan view schematically showing a pixel arrangement structure in the component area CA, according to an embodiment.

Referring to FIG. 6, the auxiliary sub-pixels Pa may be arranged in the component area CA. Each of the auxiliary sub-pixels Pa may emit any one of red light, green light, blue light, and white light. The component area CA of FIG. 6 may be the first component area CA1 and/or the second component area CA2.

The component area CA may include the transmission area TA and a pixel group PG including at least one auxiliary sub-pixel Pa. The pixel group PG and the transmission area TA may be alternately arranged in the x direction and the y direction, for example, arranged in a lattice form. The component area CA may include multiple pixel groups PG and multiple transmission areas TA.

The pixel group PG may be defined as an aggregate of sub-pixels that include the auxiliary sub-pixels Pa gathered in a preset unit. For example, as shown in FIG. 6, one pixel group PG may include eight auxiliary sub-pixels Pa arranged in a Pentile form. For example, one pixel group PG may include two red sub-pixels Pr, four green sub-pixels Pg, and two blue sub-pixels Pb.

Four auxiliary sub-pixels Pa may have a pixel arrangement structure in which the auxiliary sub-pixels Pa are arranged on vertices of a virtual square VS', respectively. In an embodiment, the virtual square VS' may be a parallelogram. The red sub-pixels Pr and the blue sub-pixels Pb may be arranged in the first sub-row 1SN, and two green sub-pixels Pg may be arranged in the second sub-row 2SN.

In the component area CA, basic units U including both a certain number of pixel groups PG and a certain number of transmission areas TA may be repeatedly arranged in the x direction and the y direction. As shown in FIG. 6, the basic unit U may have a shape in which two pixel groups PG and two transmission areas TA around the pixel groups PG are gathered in a square form. The basic unit U may be produced by sectioning repeated shapes and does not indicate that structures are disconnected.

As shown in FIG. 5, in the main display area MDA, a corresponding unit U' having the same area as the basic unit U may be set. The number of main sub-pixels Pm included in the corresponding unit U' may be greater than the number of auxiliary sub-pixels Pa included in the basic unit U. For example, the number of auxiliary sub-pixels Pa included in the basic unit U may be 16, and the number of main sub-pixels Pm included in the corresponding unit U' may be 32. A ratio of the number of auxiliary sub-pixels Pa to the number of main sub-pixels Pm per same area may be about 1:2.

Because the pixel groups PG and the transmission areas TA are alternately arranged and the number of auxiliary sub-pixels Pa included in the pixel group PG is small, the auxiliary sub-pixels Pa may be distributed more in the basic unit U.

As shown in FIG. 6, the pixel arrangement structure of the auxiliary sub-pixels Pa is a Pentile structure, and the pixel arrangement structure of the component area CA is a ½ Pentile structure because the resolution of the component area CA is ½ that of the main display area MDA. However, the pixel arrangement structures, arranging methods, etc. shown in FIGS. 5 and 6 are merely examples, and one or more embodiments are not limited thereto. The arrangement structure, the number, and the arranging method of the of auxiliary sub-pixels Pa included in the pixel group PG may vary according to the resolution of the component area CA. For example, the pixel arrangement structure of the main display area MDA may differ from that of the component area CA.

Figure 7A:
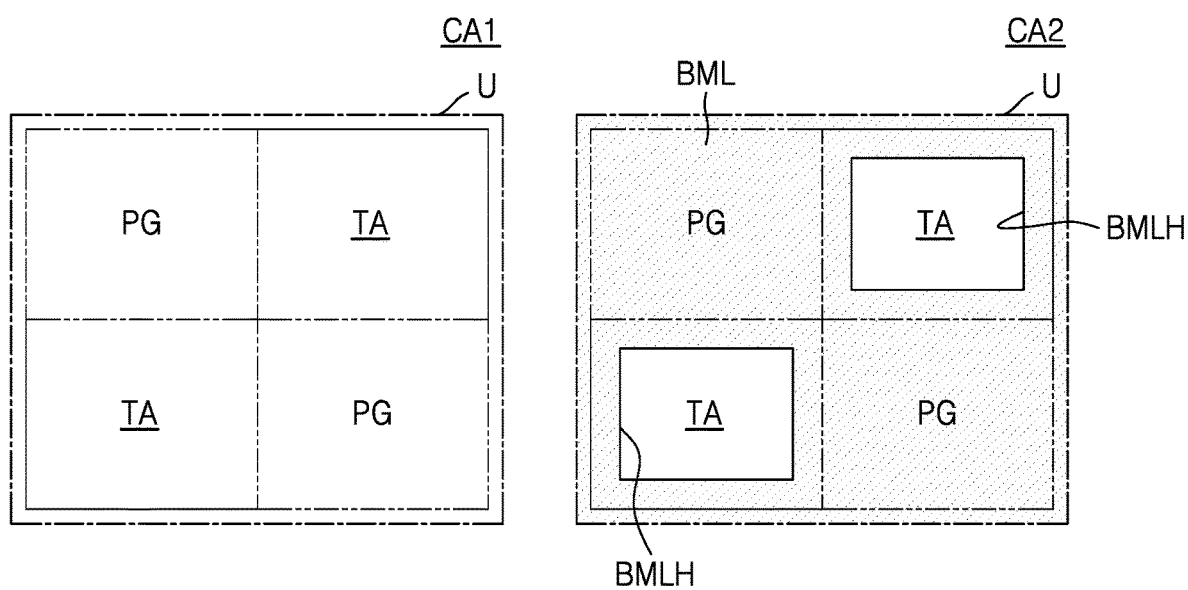
FIGS. 7A and 7B are schematic plan view of shapes of opaque layers that may be arranged in a component area, according to an embodiment.
Figure 7B:
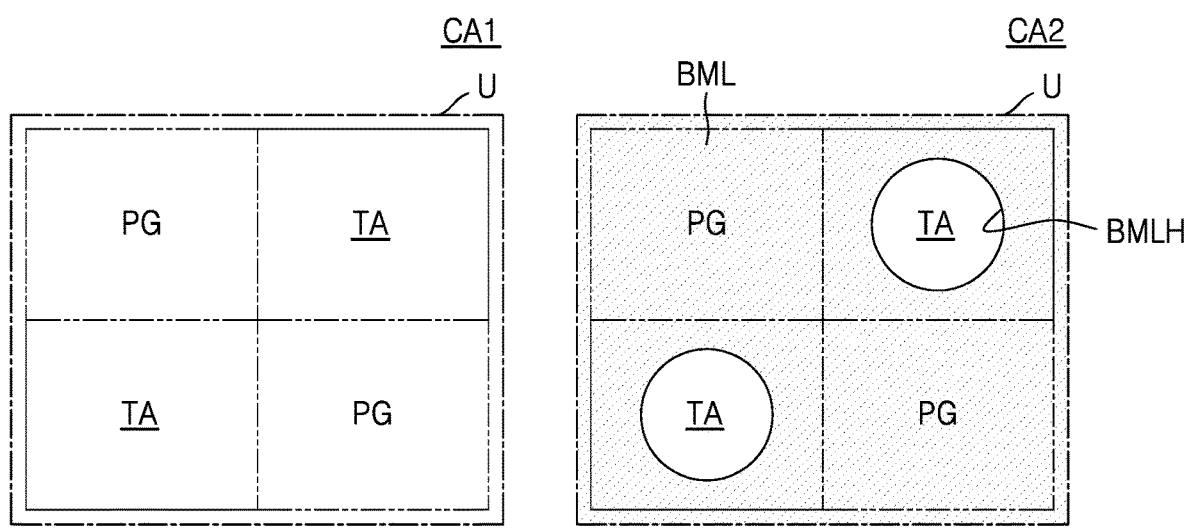

FIGS. 7A and 7B are schematic plan view of shapes of opaque layers that may be arranged in a component area, according to an embodiment.

Referring to FIGS. 7A and 7B, the opaque layer BML may not be disposed in the first component area CA1 but may be disposed in the second component area CA2. The opaque layer BML and a lower hole BMLH may have various shapes and sizes.

Referring to FIG. 7A, a shape of the lower hole BMLH is a rectangle, and the lower hole BMLH may be located not to correspond to the pixel group PG. Due to the shape and size of the lower hole BMLH, a shape and size of the transmission area TA may be defined. In a plan view, there may be two lower holes BMLH in the basic unit U, and the lower holes BMLH may be arranged alternately with the pixel groups PG.

Referring to FIG. 7B, the shape of the lower hole BMLH may be a circle. In case that the shape of the transmission area TA is approximately a circle, the diffraction of light may increase. Thus, in case that a component disposed at the bottom of the component area CA is a camera, it is good to design the shape of the transmission area TA to be approximately a circle. The shape of the lower hole BMLH may be an oval or a polygon that has at least eight sides which may be close to the circle. Various modifications may be made to the lower hole BMLH. For example, the lower hole BMLH may be provided in the singular or plural.

Figure 8:
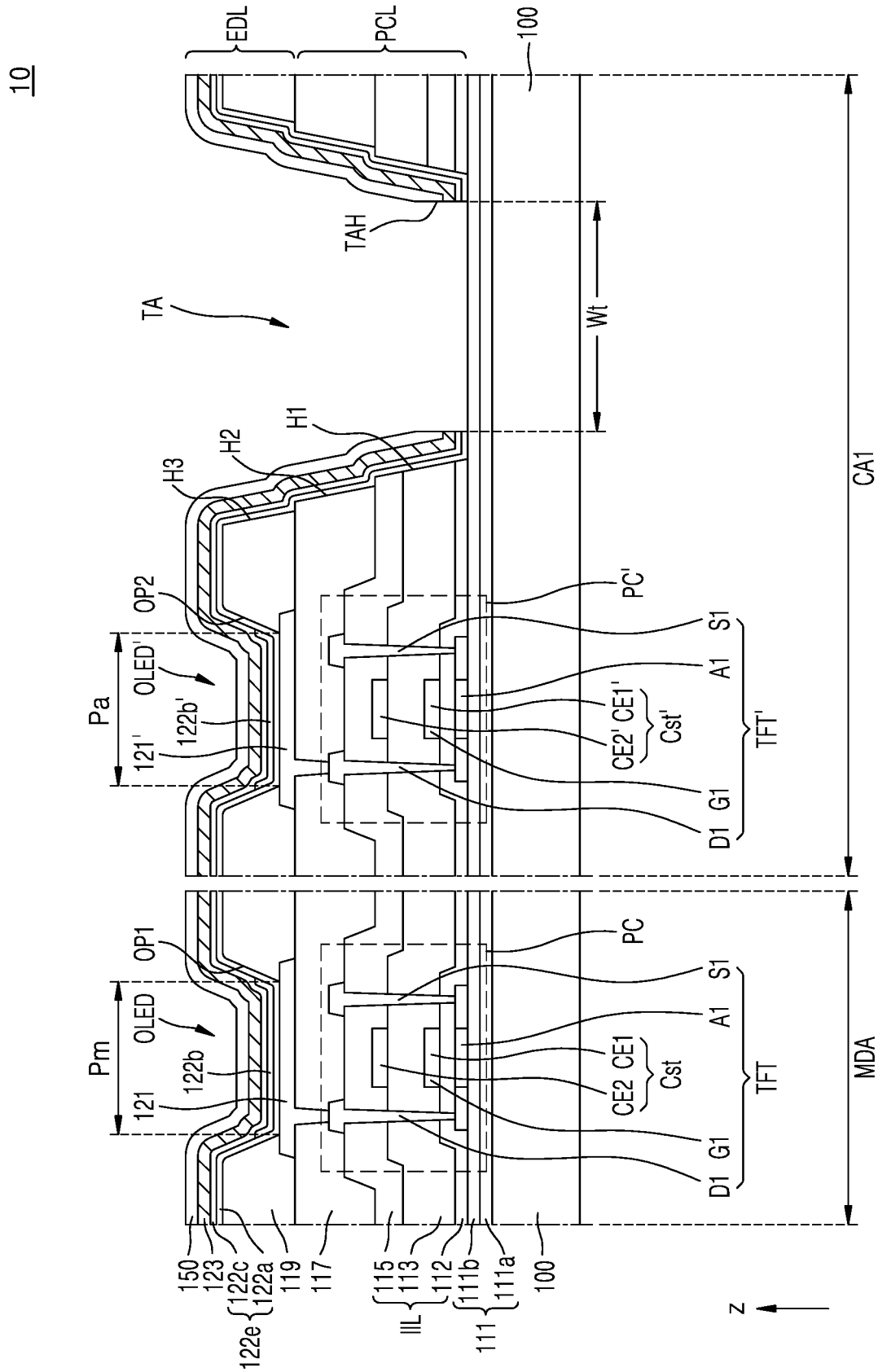
FIGS. 8 and 9 are schematic cross-sectional views showing part of the display panel, according to an embodiment.
Figure 9:
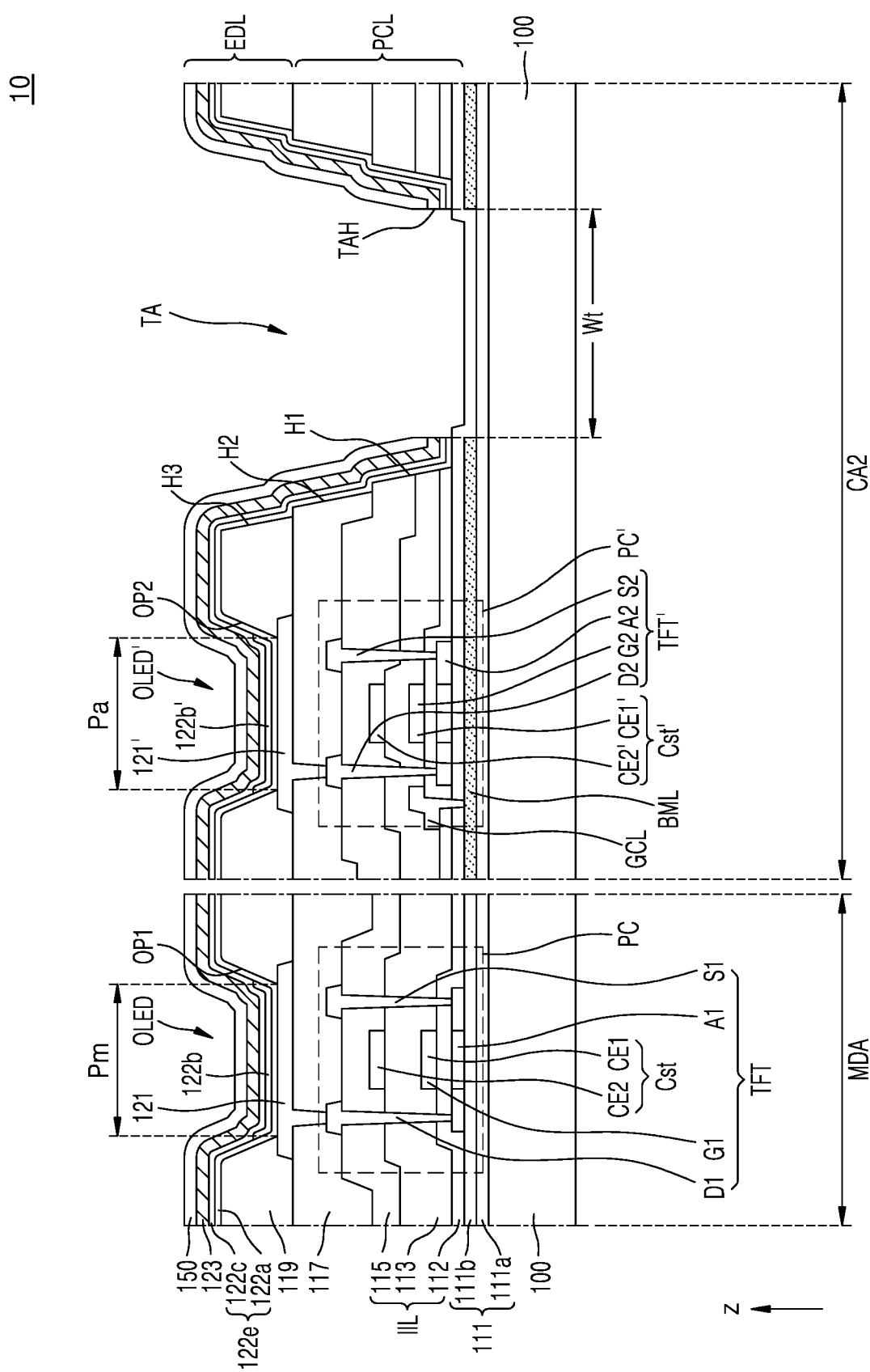

FIGS. 8 and 9 are schematic cross-sectional views showing part of the display panel, according to an embodiment and schematically show the main display area MDA and the component area CA. FIG. 8 is a cross-sectional view of the first component area CA1, and FIG. 9 is a cross-sectional view of the second component area CA2.

The main sub-pixel Pm may be disposed in the main display area MDA, and the auxiliary sub-pixel Pa and the transmission area TA may be disposed in the first and second component areas CA1 and CA2. In the main display area MDA, the main pixel circuit PC including the main thin film transistor TFT and the main capacitor Cst and the main organic light-emitting diode OLED connected to the main pixel circuit PC as a display element may be disposed. In the first and second component areas CA1 and CA2, an auxiliary pixel circuit PC' including the auxiliary thin film transistor TFT' and an auxiliary capacitor Cst' and an auxiliary organic light-emitting diode OLED', which is connected to the auxiliary pixel circuit PC' as a display element, may be disposed.

Hereinafter, a stack structure of elements included in the display panel 10 will be described. The display panel 10 may include as the substrate 100, a buffer layer 111, the circuit layer PCL, and the display element layer EDL stacked on each other.

As described above, the substrate 100 may include an insulating material such as glass, quartz polymer resin, or a combination thereof.

The buffer layer 111 may be disposed on the substrate 100 and may decrease or block the penetration of foreign materials, moisture, or external air from the bottom of the substrate 100, thereby providing a flat surface on the substrate 100. The buffer layer 111 may include an inorganic material such as oxide, nitride, or a combination thereof, an organic material, or a composite of organic/inorganic materials and may have a single-layer structure or a multilayered structure including organic/inorganic materials. Between the substrate 100 and the buffer layer 111, a barrier layer (not shown) preventing the penetration of external air may be further disposed. In some embodiments, the buffer layer 111 may include silicon oxide ($SiO_2$), silicon nitride ($SiN_x$), or a combination thereof. The buffer layer 111 may include a first buffer layer 111a and a second buffer layer 111b that are stacked on each other.

As shown in FIG. 9, in the second component area CA2, the opaque layer BML may be disposed between the first buffer layer 111a and the second buffer layer 111b. In another embodiment, the opaque layer BML may be between the substrate 100 and the first buffer layer 111a. The opaque layer BML may be disposed under the auxiliary pixel circuit PC' and may prevent the deterioration in characteristics of the auxiliary thin film transistor TFT', the deterioration being caused by light emitted from the component, etc. Also, the opaque layer BML may prevent light, which is emitted from the component, etc. or directed thereto, from being diffracted through a narrow gap between lines connected to the auxiliary pixel circuit PC'. The opaque layer BML may not be in the transmission area TA.

In some embodiments, the opaque layer BML may include lightproof metal. The opaque layer BML may be electrically connected to line GCL, which is on a different layer, through a contact hole. The opaque layer BML may receive a constant voltage or signals from the line GCL and prevent damage to the pixel circuit due to electrostatic discharge. In the second component area CA2, the opaque layer BML may be provided in plural, and in some cases, different voltages may be applied to respective opaque layers BML. For example, the opaque layer BML may receive the driving voltage ELVDD or scan signals. As the opaque layer BML receives a constant voltage or a signal, a probability that the electrostatic discharge occurs may greatly decrease. The opaque layer BML may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), copper (Cu), or a combination thereof. The opaque layer BML may be a monolayer or multilayers including the above material(s).

In other embodiments, the opaque layer BML may include a lightproof organic material. For example, the opaque layer BML may include carbon, black acryl, photoresist including a black matrix, or the like, or a combination thereof.

The circuit layer PCL may be disposed on the buffer layer 111 and may include the pixel circuits PC and PC', a first gate insulating layer 112, a second gate insulating layer 113, an interlayer insulating layer 115, and a planarization layer 117. The main pixel circuit PC may include the main thin film transistor TFT and the main capacitor Cst, and the auxiliary pixel circuit PC' may include the auxiliary thin film transistor TFT' and the auxiliary capacitor Cst'.

On the buffer layer 111, the main thin film transistor TFT and the auxiliary thin film transistor TFT' may be disposed. The main thin film transistor TFT includes a first semiconductor layer A1, a first gate electrode G1, a first source electrode S1, and a first drain electrode D1, and the auxiliary thin film transistor TFT' includes a second semiconductor layer A2, a second gate electrode G2, a second source electrode S2, and a second drain electrode D2. The main thin film transistor TFT may be electrically connected to the main organic light-emitting diode OLED and drive the same. The auxiliary thin film transistor TFT' may be electrically connected to the auxiliary organic light-emitting diode OLED' and drive the same.

The first and second semiconductor layers A1 and A2 may be disposed on the buffer layer 111 and include polysilicon. In other embodiments, the first and second semiconductor layers A1 and A2 may include amorphous silicon. In other embodiments, the first and second semiconductor layers A1 and A2 may each include oxide material comprising at least one material selected from the group consisting of indium (In), gallium (Ga), stannum (Sn), zirconium (Zr), vanadium (V), hafnium (Hf), cadmium (Cd), germanium (Ge), Cr, Ti, and zinc (Zn). The first and second semiconductor layers A1 and A2 may each include a channel area and source and drain areas doped with impurities.

As shown in FIG. 9, the second semiconductor layer A2 may overlap the opaque layer BML with the second buffer layer 111b therebetween. In an embodiment, a width of the second semiconductor layer A2 may be less than that of the opaque layer BML, and thus, in case projected in a direction perpendicular to the substrate 100, the second semiconductor layer A2 may entirely overlap the opaque layer BML.

The first gate insulating layer 112 may cover the first and second semiconductor layers A1 and A2. The first gate insulating layer 112 may include an inorganic insulating material such as $SiO_2$, $SiN_x$, silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), or a combination thereof. The first gate insulating layer 112 may be a monolayer or multilayers including the above inorganic insulating material(s).

On the first gate insulating layer 112, the first gate electrode G1 and the second gate electrode G2 may be disposed to overlap the first semiconductor layer A1 and the second semiconductor layer A2, respectively. The first gate electrode G1 and the second gate electrode G2 may be a monolayer or multilayers including Mo, Al, Cu, Ti, or the like. For example, the first gate electrode G1 and the second gate electrode G2 may each be a monolayer including Mo.

The second gate insulating layer 113 may cover the first gate electrode G1 and the second gate electrode G2. The second gate insulating layer 113 may include an inorganic insulating material such as $SiO_2$, $SiN_x$, SiON, $Al_2O_3$, $TiO_2$, $Ta_2O_5$, $HfO_2$, $ZnO_2$, or a combination thereof. The second gate insulating layer 113 may be a monolayer or multilayers including the above inorganic insulating material(s).

On the second gate insulating layer 113, a first upper electrode CE2 of the main capacitor Cst and a second upper electrode CE2' of the auxiliary capacitor Cst' are disposed.

In the main display area MDA, the first upper electrode CE2 may overlap the first gate electrode G1 thereunder. The first gate electrode G1 and the first upper electrode CE2, which overlap each other with the second gate insulating layer 113 therebetween, may form the main capacitor Cst. The first gate electrode G1 may be a first lower electrode CE1 of the main capacitor Cst.

In the first and second component areas CA1 and CA2, the second upper electrode CE2' may overlap the second gate electrode G2 thereunder. The second gate electrode G2 and the second upper electrode CE2', which overlap each other with the second gate insulating layer 113 therebetween, may form the auxiliary capacitor Cst'. The second gate electrode G2 may be the second lower electrode CE1' of the auxiliary capacitor Cst'.

The first upper electrode CE2 and the second upper electrode CE2' may each include Al, Pt, Pd, Ag, Mg, Au, Ni, Nd, Ir, Cr, Ca, Mo, Ti, W, and/or Cu and may be a monolayer or multilayers including the above material(s).

The interlayer insulating layer 115 may cover the first upper electrode CE2 and the second upper electrode CE2'. The interlayer insulating layer 115 may include $SiO_2$, $SiN_x$, SiON, $Al_2O_3$, $TiO_2$, $Ta_2O_5$, $HfO_2$, $ZnO_2$, or the like, or a combination thereof. The interlayer insulating layer 115 may be a monolayer or multilayers including the above inorganic insulating material(s).

The first gate insulating layer 112, the second gate insulating layer 113, and the interlayer insulating layer 115 may be collectively referred to as an inorganic insulating layer IIL. The inorganic insulating layer IIL may have a first hole H1 corresponding to the transmission area TA. The first hole H1 may expose part of an upper surface of the buffer layer 111 or the substrate 100. The first hole H1 may be formed as an opening of the first gate insulating layer 112, an opening of the second gate insulating layer 113, and an opening of the interlayer insulating layer 115 overlap, the openings corresponding to the transmission area TA. Such openings may be separately formed through separate processes or simultaneously formed through the same process. In case that the openings are formed through separate processes, an inner surface of the first hole H1 may not be smooth and may have a step difference, for example, a stair shape.

Unlike the above description, the inorganic insulating layer IIL may have a groove instead of the first hole H1 through which the buffer layer 111 may be exposed. As another example, the inorganic insulating layer IIL may not have the groove or the first hole H1 corresponding to the transmission area TA. Because the inorganic insulating layer IIL includes an inorganic insulating material that mostly has great light transmittance, the inorganic insulating layer IIL may have sufficient transmittance even though there is no hole or groove corresponding to the transmission area TA. Thus, the inorganic insulating layer IIL may help the component receive/transmit a sufficient amount of light.

The source electrodes S1 and S2 and the drain electrodes D1 and D2 may be disposed on the interlayer insulating layer 115. The source electrodes S1 and S2 and the drain electrodes D1 and D2 may each include a conductive material such as Mo, Al, Cu, Ti, or a combination thereof, and may be multilayers or a monolayer including the above material(s). For example, the source electrodes S1 and S2 and the drain electrodes D1 and D2 may have a multilayered structure of Ti/Al/Ti.

The planarization layer 117 may be disposed to cover the source electrodes S1 and S2 and the drain electrodes D1 and D2. The planarization layer 117 may have a flat upper surface so that a first pixel electrode 121 and a second pixel electrode 121' disposed thereabove may be flat.

The planarization layer 117 may include an organic material or an inorganic material and may have a monolayer structure or a multilayered structure. The planarization layer 117 may include general-purpose polymer such as benzocyclobutene (BCB), polyimide, hexamethyldisiloxane (HMDSO), polymethylmethacrylate (PMMA) or polystyrene (PS), a polymer derivative having a phenol-based group, an acryl-based polymer, an imide-based polymer, an aryl-ether-based polymer, an amide-based polymer, a fluorine-based polymer, a p-xylene-based polymer, a vinyl alcohol-based polymer, or the like, or a combination thereof. The planarization layer 117 may include an inorganic insulating material such as $SiO_2$, $SiN_x$, SiON, $Al_2O_3$, $TiO_2$, $Ta_2O_5$, $HfO_2$, or $ZnO_2$. In forming the planarization layer 117, mechanochemical polishing may be performed on an upper surface of the planarization layer 117 to provide the flat upper surface after the formation of the planarization layer 117.

The planarization layer 117 may have a second hole H2 corresponding to the transmission area TA. The second hole H2 may overlap the first hole H1. Referring to FIGS. 8 and 9, the second hole H2 may be greater than the first hole H1. In other embodiments, the planarization layer 117 covers a periphery of the first hole H1 of the inorganic insulating layer IIL, and an area of the second hole H2 may be less than that of the first hole H1.

The planarization layer 117 may have a via hole through which any one of the first source electrode S1 and the first drain electrode D1 of the main thin film transistor TFT is exposed, and the first pixel electrode 121 may be electrically connected to the main thin film transistor TFT by contacting the first source electrode S1 or the first drain electrode D1 through the via hole. Also, the planarization layer 117 may have a via hole through which any one of the second source electrode S2 and the second drain electrode D2 of the auxiliary thin film transistor TFT' is exposed, and the second pixel electrode 121' may be electrically connected to the auxiliary thin film transistor TFT' by contacting the second source electrode S2 or the second drain electrode D2 through the via hole.

The first pixel electrode 121 and the second pixel electrode 121' may each include conductive oxide such as indium tin oxide (ITO), indium zinc oxide (IZO), zinc oxide (ZnO), indium oxide ($In_2O_3$), indium gallium oxide (IGO), aluminum zinc oxide (AZO), or a combination thereof. The first pixel electrode 121 and the second pixel electrode 121' may include a reflective layer including Ag, Mg, Al, Pt, Pd, Au, Ni, Nd, Ir, Cr, or a compound thereof. For example, the first pixel electrode 121 and the second pixel electrode 121' may have a structure in which layers including ITO, IZO, ZnO or $In_2O_3$ are disposed above/under the above reflective layer. The first pixel electrode 121 and the second pixel electrode 121' may have a stack structure of ITO/Ag/ITO.

A pixel-defining layer 119 may cover edges of each of the first pixel electrode 121 and the second pixel electrode 121' on the planarization layer 117 and may include first and second openings OP1 and OP2 exposing centers of the first and second pixel electrodes 121 and 121'. Emission areas of the organic light-emitting diodes OLED and OLED', for example, sizes and shapes of the main and auxiliary sub-pixels Pm and Pa, may be defined by the first and second openings OP1 and OP2.

The pixel-defining layer 119 may prevent arcs, etc. from being generated at edges of the pixel electrodes 121 and 121' by increasing a distance between the edges of the pixel electrodes 121 and 121' and the opposite electrode 123 disposed above the pixel electrodes 121 and 121'. The pixel-defining layer 119 may include an organic insulating material such as polyimide, polyamide, acryl resin, BCB, HMDSO, phenol resin, or a combination thereof, and may be formed by using a spin coating method, etc.

The pixel-defining layer 119 may include a third hole H3 located in the transmission area TA. The third hole H3 may overlap the first hole H1 and the second hole H2. Due to the first to third holes H1 to H3, the light transmittance of the transmission area TA may be improved. As shown in FIGS. 8 and 9, the buffer layer 111 may be continuously disposed corresponding to the transmission area TA, but the buffer layer 111 may include a hole located in the transmission area TA. On inner surfaces of the first to third holes H1 to H3, part of the opposite electrode 123 described below may be disposed.

Inside the first opening OP1 and the second opening OP2 of the pixel-defining layer 119, a first emission layer 122b and a second emission layer 122b' may be disposed respectively corresponding to the first pixel electrode 121 and the second pixel electrode 121'. The first emission layer 122b and the second emission layer 122b' may include a polymer material or a low molecular weight material and may emit red light, green light, blue light, or white light.

An organic functional layer 122e may be disposed above and/or under the first emission layer 122b and the second emission layer 122b'. The organic functional layer 122e may include a first functional layer 122a and/or a second functional layer 122c. The first functional layer 122a or the second functional layer 122c may not be formed.

The first functional layer 122a may be disposed under the first emission layer 122b and the second emission layer 122b'. The first functional layer 122a may be a monolayer or multilayers including an organic material. The first functional layer 122a may be a hole transport layer (HTL) having a monolayer structure. As another example, the first functional layer 122a may include a hole injection layer (HIL) and an HTL. The first functional layer 122a may be integrally formed to correspond to the organic light-emitting diodes OLED and OLED' included in the main display area MDA and the first and second component areas CA1 and CA2.

The second functional layer 122c may be disposed on the first emission layer 122b and the second emission layer 122b'. The second functional layer 122c may be a monolayer or multilayers including an organic material. The second functional layer 122c may include an electron transport layer (ETL) and/or an electron injection layer (EIL). The second functional layer 122c may be integrally formed to correspond to the organic light-emitting diodes OLED and OLED' included in the main display area MDA and the first and second component areas CA1 and CA2.

The opposite electrode 123 may be disposed on the second functional layer 122c. The opposite electrode 123 may include a conductive material having a low work function. For example, the opposite electrode 123 may include a (translucent) transparent layer including Ag, Mg, Al, Pt, Pd, Au, Ni, Nd, Ir, Cr, Li, Ca, or an alloy thereof. As another example, the opposite electrode 123 may further include a layer including ITO, IZO, ZnO, or $In_2O_3$ on the (translucent) transparent layer including the aforementioned material(s). The opposite electrode 123 may be integrally formed to correspond to the organic light-emitting diodes OLED and OLED' included in the main display area MDA and the first and second component areas CA1 and CA2.

Layers, which are formed from the first pixel electrode 121 to the opposite electrode 123 in the main display area MDA, may form the main organic light-emitting diode OLED. Layers, which are formed from the second pixel electrode 121' to the opposite electrode 123 in the component area CA, may form the auxiliary organic light-emitting diode OLED'.

On the opposite electrode 123, an upper layer 150 including an organic material may be formed. The upper layer 150 may be a layer prepared to protect the opposite electrode 123 and improve the light extraction efficiency. The upper layer 150 may include an organic material having a greater refractive index than that of the opposite electrode 123. As another example, the upper layer 150 may be formed by stacking layers having different refractive indices. For example, the upper layer 150 may be formed by stacking a high refractive index layer/a low refractive index layer/a high refractive index layer. A refractive index of the high refractive index layer may be equal to or greater than about 1.7, and a refractive index of the low refractive index layer may be less than or equal to about 1.3.

The upper layer 150 may additionally include LiF. As another example, the upper layer 150 may additionally include an inorganic insulating material such as $SiO_2$ or $SiN_x$.

The first functional layer 122a, the second functional layer 122c, the opposite electrode 123, and the upper layer 150 may include a through hole TAH corresponding to the transmission area TA. For example, first functional layer 122a, the second functional layer 122c, the opposite electrode 123, and the upper layer 150 may respectively have openings corresponding to the transmission area TA. Areas of the openings may be substantially the same. For example, an area of the opening of the opposite electrode 123 may be substantially the same as an area of the through hole TAH.

The description that the through hole TAH corresponds to the transmission area TA may indicate that the through hole TAH overlaps the transmission area TA. The area of the through hole TAH may be less than that of the first hole H1 formed in the inorganic insulating layer IIL. To this end, FIGS. 8 and 9 show that a width Wt of the through hole TAH is less than the width of the first hole H1. Here, the area of the through hole TAH may be defined as an area of an opening having the least area among the openings forming the through hole TAH. The area of the first hole H1 may also be defined as an area of an opening having the least area among the openings forming the first hole H1.

Due to the through hole TAH, part of the opposite electrode 123 may not be in the transmission area TA, and thus the light transmittance in the transmission area TA may be greatly improved. The opposite electrode 123 including the above through hole TAH may be formed by using various methods. After a material forming the opposite electrode 123 is formed on the entire substrate 100, a portion of the material corresponding to the transmission area TA may be removed through laser lift off, and thus, the opposite electrode 123 having the through hole TAH may be formed. In another embodiment, the opposite electrode 123 having the through hole TAH may be formed by using a metal self-patterning (MSP) method. In another embodiment, the opposite electrode 123 having the through hole TAH may be formed by using a method of depositing the opposite electrode 123 by using a fine metal mask (FMM).

Figure 10:
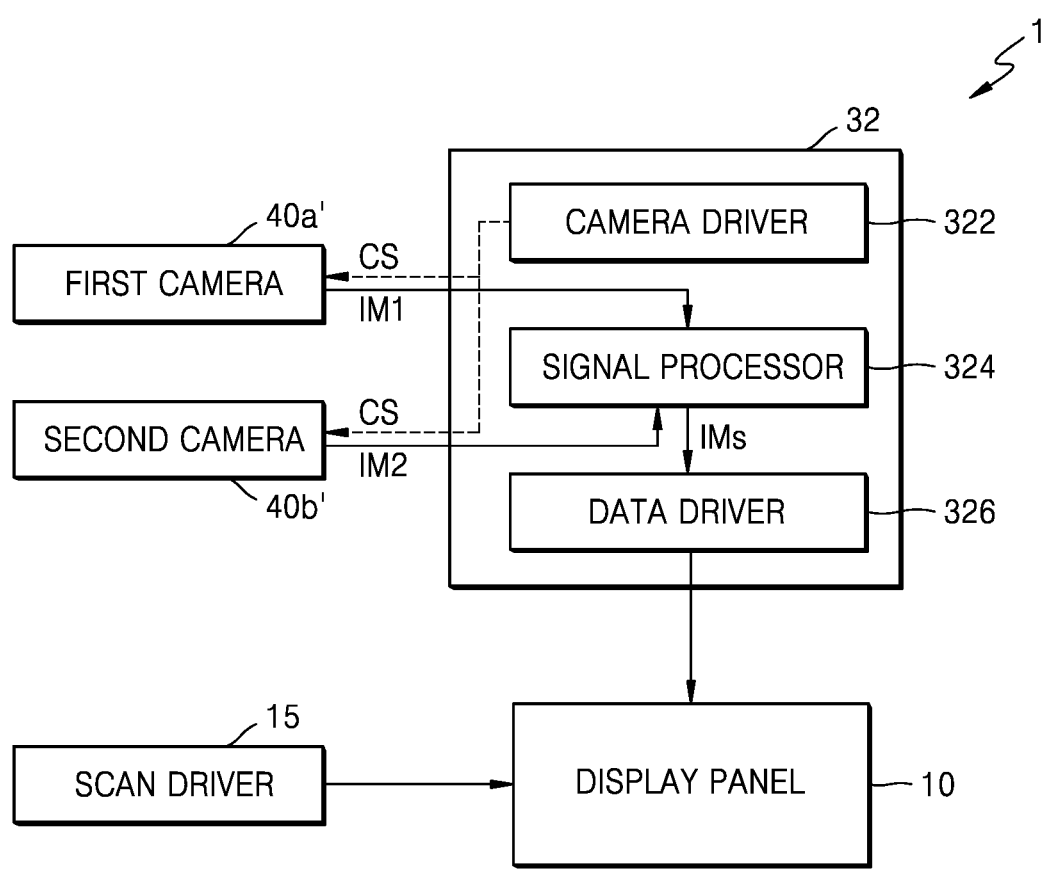
FIGS. 10 and 11 are schematic views of a display device, according to an embodiment.
Figure 11:
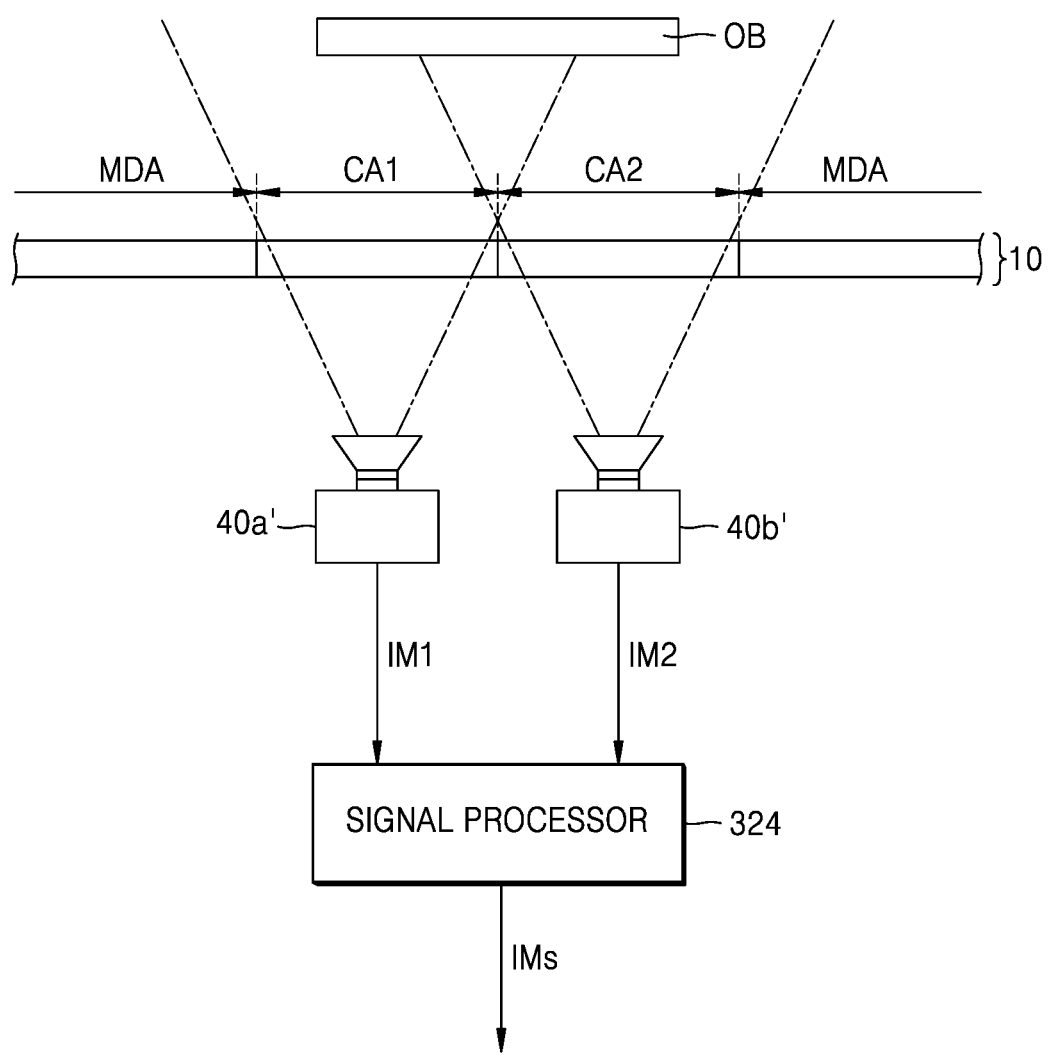
Figure 12:
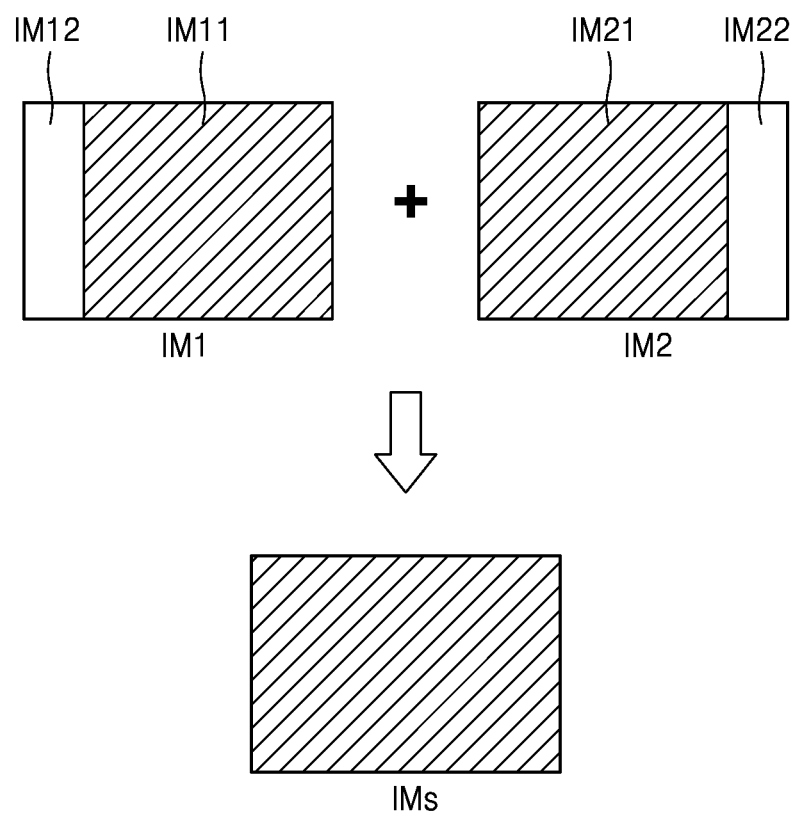
FIG. 12 is an example view for explaining an image signal synthesis method according to an embodiment.

FIGS. 10 and 11 are schematic views of a display device, according to an embodiment. FIG. 12 is an example view for explaining an image signal synthesis method according to an embodiment.

Referring to FIGS. 10 and 11, the display device 1 may include the display panel 10, a scan driver 15, and a display driver 32. The display device 1 may further include a first camera 40a', which is disposed corresponding to the first component area CA1 of the display panel 10 as a first component, and a second camera 40b' disposed corresponding to the second component area CA2 as a second component.

The first camera 40a' and the second camera 40b' may be disposed adjacent to each other to face in the same direction and may be embedded in a member of an integral type. In an embodiment, the first camera 40a' and the second camera 40b' may have a same performance. In another embodiment, the first camera 40a' and the second camera 40b' may have different performances. For example, the first camera 40a' may be a low-sensitivity camera having a high resolution, and the second camera 40b' may be a high-sensitivity camera having a low resolution.

The first camera 40a' and the second camera 40b' may each include an image sensor. The image sensor may include a photoelectric conversion element such as a charge coupled device (CCD) or a complementary metal oxide semiconductor (CMOS). The image sensor may obtain image information by capturing a front scene. On a front part of the image sensor, a color filter and a lens (not shown), which receive optical signals, may be included. The color filter may allow light in a designated band to pass through and may be an RGB Bayer matrix filter.

The image sensor may include light-receiving pixels arranged in a two-dimensional array. Each light-receiving pixel of the image sensor may receive light passing through the corresponding color filter and may convert the light into an electrical signal. According to the corresponding color filter, the light-receiving pixel may be a red pixel R, a green pixel G, or a blue pixel B. Sizes, shapes, and arrangements of the light-receiving pixels of the image sensor may be the same as or different from those of the sub-pixels of the display panel 10. For example, some of the light-receiving pixels of the image sensor may be located corresponding to the pixel groups PG, and others thereof may be located corresponding to the transmission area TA.

The display device 1 may display an image on the display area DA of the display panel 10 in a display mode, and the first camera 40a' and the second camera 40b' may be inactive (off). The display device 1 may generate an image corresponding to electrical signals, which may be input from the first camera 40a' and the second camera 40b' that are on in a shooting mode, and may display the image on the display area DA of the display panel 10. The image may be displayed on the main display area MDA and/or the first and second component areas CA1 and CA2.

In each of the first and second component areas CA1 and CA2, as shown in FIG. 6, the pixel groups PG and the transmission area TA may be disposed. As shown in FIGS. 7A and 7B, the opaque layer BML may not be disposed in the first component area CA1, but in the second component area CA2, the opaque layer BML may be disposed in an area other than the transmission area TA, for example, disposed corresponding to the pixel group PG and signal lines.

Referring to FIGS. 2A and 2B, the main display area MDA may be formed between the first component area CA1 and the second component area CA2, but referring to FIG. 11, the main display area MDA may not be formed between the first component area CA1 and the second component area CA2 because the first component area CA1 and the second component area CA2 may be formed adjacent to each other. In some embodiments, the transmission area TA may be formed between the first component area CA1 and the second component area CA2.

The display driver 32 may be realized as various numbers of hardware and/or software components that may execute certain functions. For example, the display driver 32 may be a data processor embedded in hardware and having a physically-structured circuit to perform functions expressed in code or commands included in a program. Examples of the data processor embedded in hardware may include a microprocessor, a central processing unit (CPU), a processor core, a multiprocessor, an application-specific integrated circuit (ASIC), a field programmable gate array (FPGA), and the like, but one or more embodiments are not limited thereto.

The display driver 32 may include a camera driver 322, a signal processor 324, and a data driver 326.

The camera driver 322 may activate the first camera 40a' and the second camera 40b' in the shooting mode and may output control signals CS used to control the driving of the first camera 40a' and/or the second camera 40b'. The activation of the first camera 40a' and the second camera 40b' may be selectively performed according to an activation request of a user, for example, execution of a related application, etc. As another example, when an event occurs which relates to the activation of the first camera 40a' and the second camera 40b', the first camera 40a' and the second camera 40b' may be automatically activated.

Viewing angles of the first camera 40a' and the second camera 40b' may be the same or different. A real-world area in an image captured by the first camera 40a' may be the same as or partially overlap a real-world area in an image captured by the second camera 40b'.

The signal processor 324 may reduce noise of image signals and may perform signal processing for quality enhancement, for example, gamma correction, color filter array interpolation, a color matrix, color correction, color enhancement, or the like.

The signal processor 324 may process output signals from the first camera 40a' and the second camera 40b' and may output the processed output signals to the data driver 326. The output signal from the first camera 40a' may be a first image signal IM1, and the output signal from the second camera 40b' may be a second image signal IM2. The light-receiving pixels of the first camera 40a' may obtain the first image signal IM1 used to capture a scene including an object OB by using light incident to the first component area CA1. The light-receiving pixels of the second camera 40b' may obtain the second image signal IM2 used to capture a scene including the object OB by using light incident to the second component area CA2.

In some embodiments, the signal processor 324 may correct image signals by analyzing brightness (illuminance) of the image signal. The signal processor 324 may receive the first image signal IM1 from the first camera 40a' and the second image signal IM2 from the second camera 40b' and may sequentially read brightness values according to coordinates of the light-receiving pixels of the first image signal IM1 and the second image signal IM2, thereby generating a synthesis image signal IMs. The first image signal IM1 and the second image signal IM2 may each include deterioration data. The deterioration data may be a brightness value (pixel data) deviating a reference brightness value range. For example, the signal processor 324 may determine, as the deterioration data, the brightness value of the first image signal IM1 that is equal to or greater than the reference brightness value. The synthesis image signal IMs may be an image signal which is generated by converting the deterioration data of the first image signal IM1, based on pixel data of the second image signal IM2.

In an embodiment, the signal processor 324 may read pixel data of each light-receiving pixel of the first image signal IM1 according to coordinates of the light-receiving pixels and may detect the deterioration data of which the brightness value is equal to or greater than a reference brightness value. The signal processor 324 may replace the deterioration data of the first image signal IM1 with the pixel data of the light-receiving pixel at corresponding coordinates of the second image signal IM2, and thus may generate the synthesis image signal IMs. In another embodiment, the signal processor 324 may synthesize the first image signal IM1 and the second image signal IM2 by setting a weight, thus generating a synthesis image signal IMs. For example, the synthesis image signal IMs may be determined according to the following Equation 1.

$$IMs(x,y)=IM1(x,y)*w+IM2(x,y)*(1-w) \quad (1)$$

where IM1$(x,y)$ is a brightness value of (x,y) coordinate of the first image signal IM1, IM2$(x,y)$ is a brightness value of (x,y) coordinate of the second image signal IM2, IMs(x,y) is a brightness value of (x,y) coordinate of the synthesis image signal IMs, and w is a weight. The coordinates of Equation 1 are coordinates of the light-receiving pixels of the image sensor.

The detection of the deterioration data of the first and second image signals IM1 and IM2 may be performed according to various methods other than the aforementioned method. For example, the signal processor 324 may convert the first image signal IM1 and the second image signal IM2 into signals in a frequency area by using a Fourier Transform (e.g. Discrete Fourier Transform (DFT)), determine, as the deterioration data, the pixel data of the first image signal IM1 having an amplitude greater than a reference amplitude, and convert the deterioration data of the first image signal IM1 into pixel data of the light-receiving pixel of corresponding coordinates of the second image signal IM2, thereby generating the synthesis image signal IMs.

As shown in FIG. 12, the signal processor 324 may arrange the first image signal IM1 and the second image signal IM2 by an image registration of the first image signal IM1 and the second image signal IM2. The signal processor 324 may generate the synthesis image signal IMs based on image signals IM11 and IM21 in corresponding areas and may not use image signals IM12 and IM22 in areas, other than the corresponding areas, for image synthesis.

Because the opaque layer BML is not disposed in the first component area CA1, light may be diffracted due to a gap between signal lines in the first component area CA1, but the transmittance in the first component area CA1 may be greater than that in the second component area CA2. Because the opaque layer BML may be located corresponding to the pixel group PG and the signal lines in the second component area CA2, the transmittance in the second component area CA2 may be less than that in the first component area CA1, but the light diffraction may be prevented.

The display device 1 according to an embodiment may generate a synthesis image signal IMs by considering a difference between pixel structures of the first and second component areas CA1 and CA2, for example, a difference between image signals according to the arrangement of the opaque layer BML. For example, the display device according to an embodiment may detect the deterioration data according to the light diffraction from the first image signal IM1 generated by the image sensor of the first component area CA1 and correct the deterioration data based on the pixel data of a corresponding area of the second image signal IM2 generated by the image sensor of the second component area CA2, thereby providing a high-quality image signal. As another example, the display device 1 may separate a foreground and a background from the first image signal IM1 and the second image signal IM2, the foreground such as a person may mainly use the first image signal IM1 generated by the image sensor of the first component area CA1, and the background may mainly use the second image signal IM2 generated by the image sensor of the second component area CA2. Therefore, a clear image with no diffraction may be generated.

The signal processor 324 may output the synthesis image signal IMs to the data driver 326. The data driver 326 may output data signals in a voltage and/or a current type corresponding to the synthesis image signal IMs to the main and auxiliary sub-pixels Pm and Pa of the display panel 10, in response to the output of scan signals from the scan driver 15 to the main and auxiliary sub-pixels Pm and Pa.

The signal processor 324 may output the first image signal IM1 or the second image signal IM2 to the data driver 326 without image synthesis, according to a user request.

Figure 13:
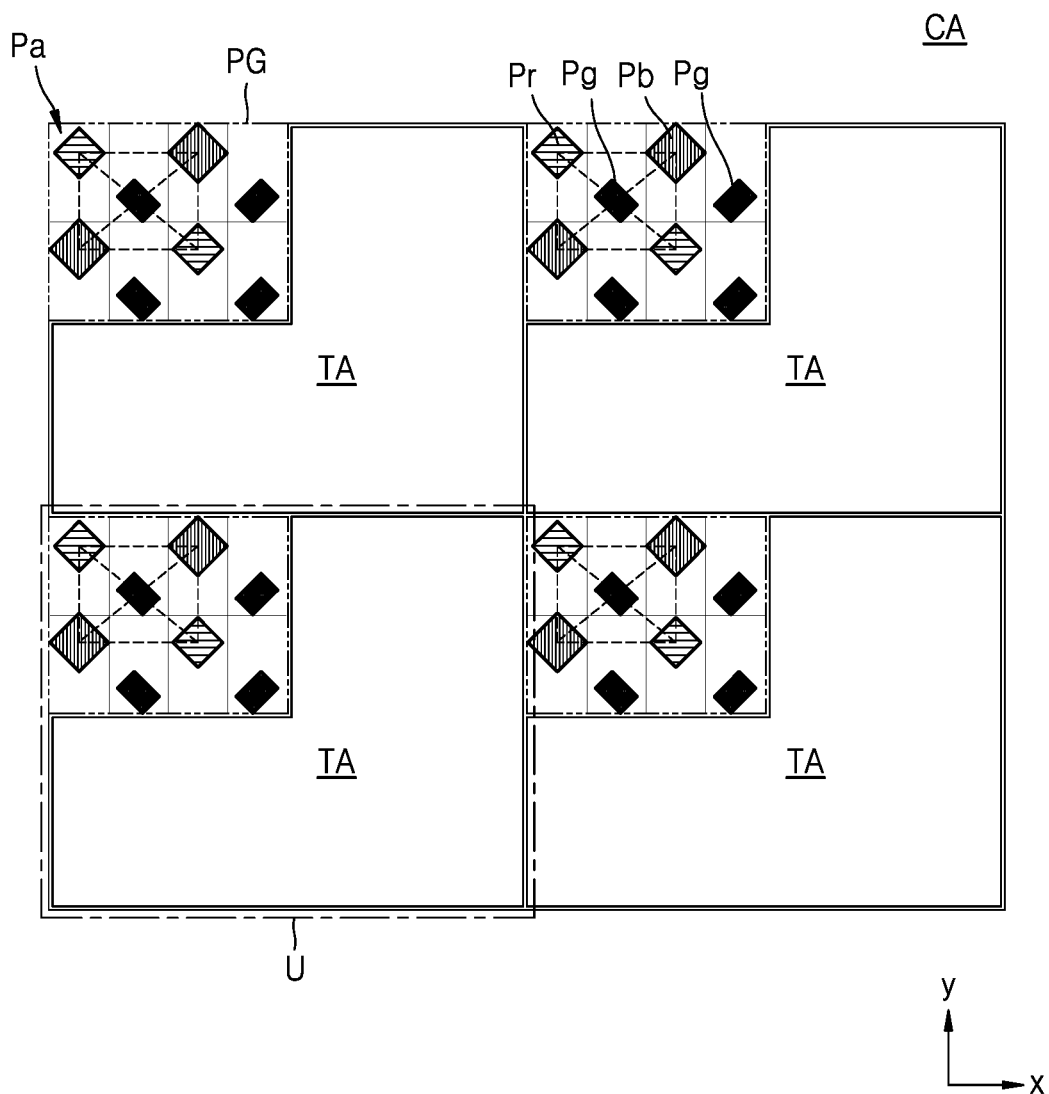
FIG. 13 is a plan view schematically showing a pixel arrangement structure in a component area according to an embodiment.
Figure 14A:
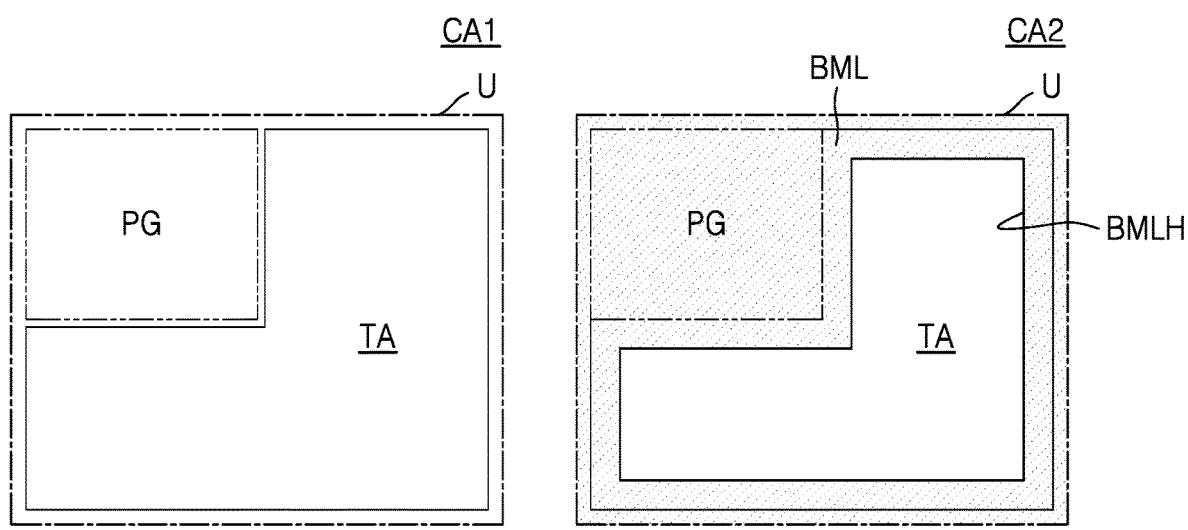
FIGS. 14A and 14B are schematic plan views of shapes of an opaque layer that may be disposed in the component area.
Figure 14B:
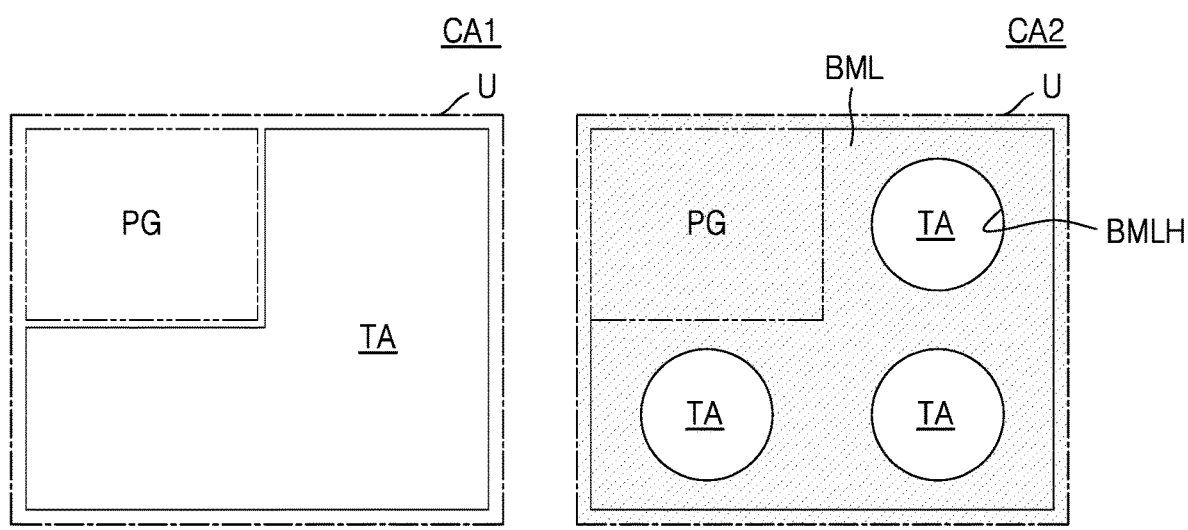

FIG. 13 is a plan view schematically showing a pixel arrangement structure in the component area CA, according to an embodiment. FIGS. 14A and 14B are schematic plan views of shapes of the opaque layer that may be disposed in the component area. The component area CA of FIG. 13 may be the first component area CA1 and the second component area CA2.

Referring to FIG. 13, the pixel arrangement structure of the component area CA according to an embodiment may be a ¼ Pentile structure. In the embodiment, in a pixel group PG, eight auxiliary sub-pixels Pa may be arranged in a Pentile form, but the basic unit U may include only one pixel group PG. Remaining areas of the basic unit U may be the transmission areas TA. For example, an area of a transmission area TA of the component area CA may be about ¾ the area of the component area CA. According to the embodiments of FIGS. 5 and 13, the number of auxiliary sub-pixels Pa and the number of main sub-pixels Pm arranged per the same area may be in a ratio of about 1:4. One pixel group PG may be surrounded by the transmission area TA.

Referring to FIGS. 14A and 14B, the opaque layer BML may not be disposed in the first component area CA1 but may be disposed in the second component area CA2. Shapes and sizes of the opaque layer BML and the lower hole BMLH may vary.

Referring to FIG. 14A, the lower hole BMLH may have a rectangular "L" shape and may not correspond to the pixel group PG. Referring to FIG. 14B, the lower hole BMLH may have a circular shape and may be provided in plural.

The above embodiments are examples in which the components are respectively arranged in the component areas, but in other embodiments, a single component may be moved between multiple component areas and perform functions.

Figure 15:
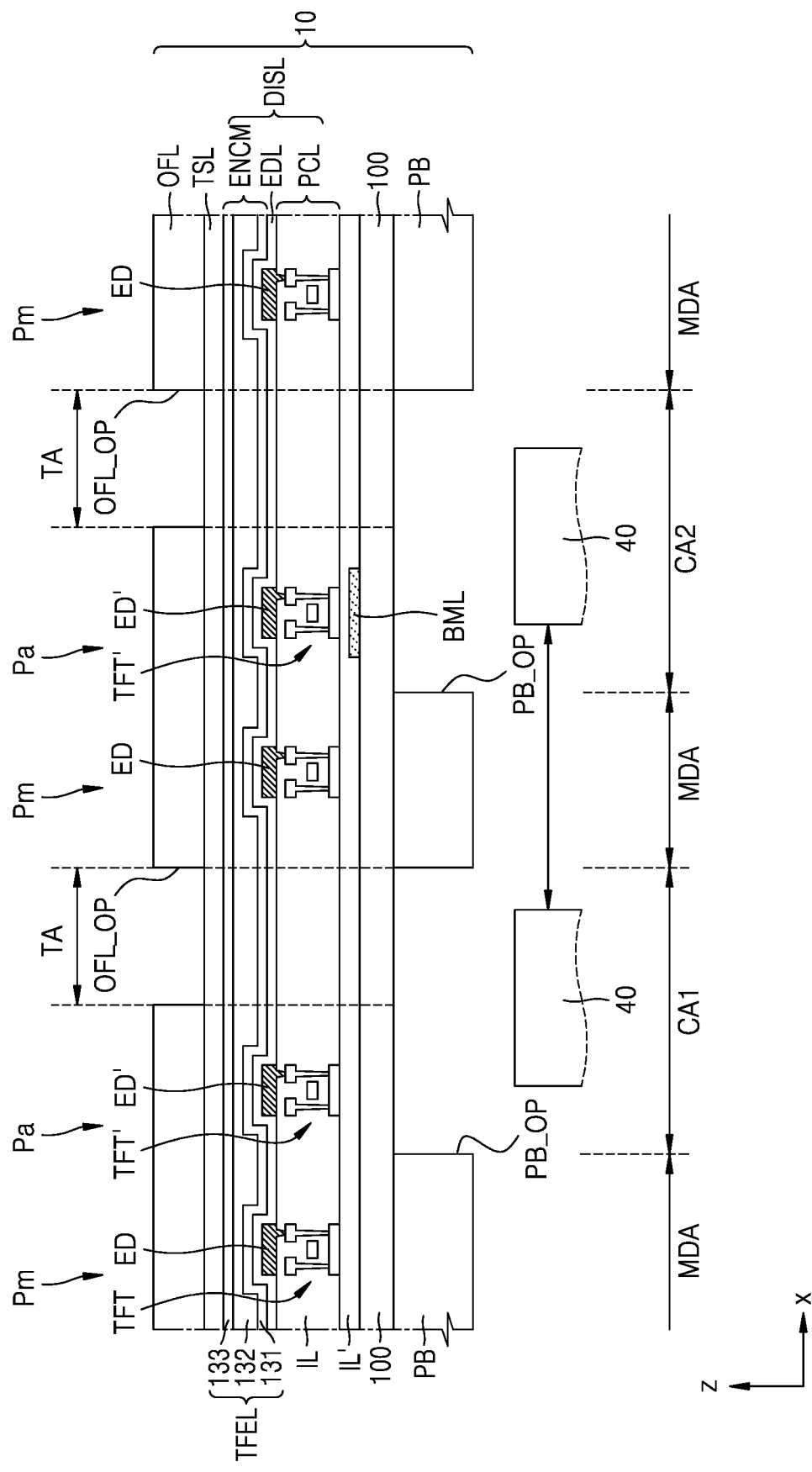
FIG. 15 is a schematic cross-sectional view of a display panel according to embodiments.
Figure 16:
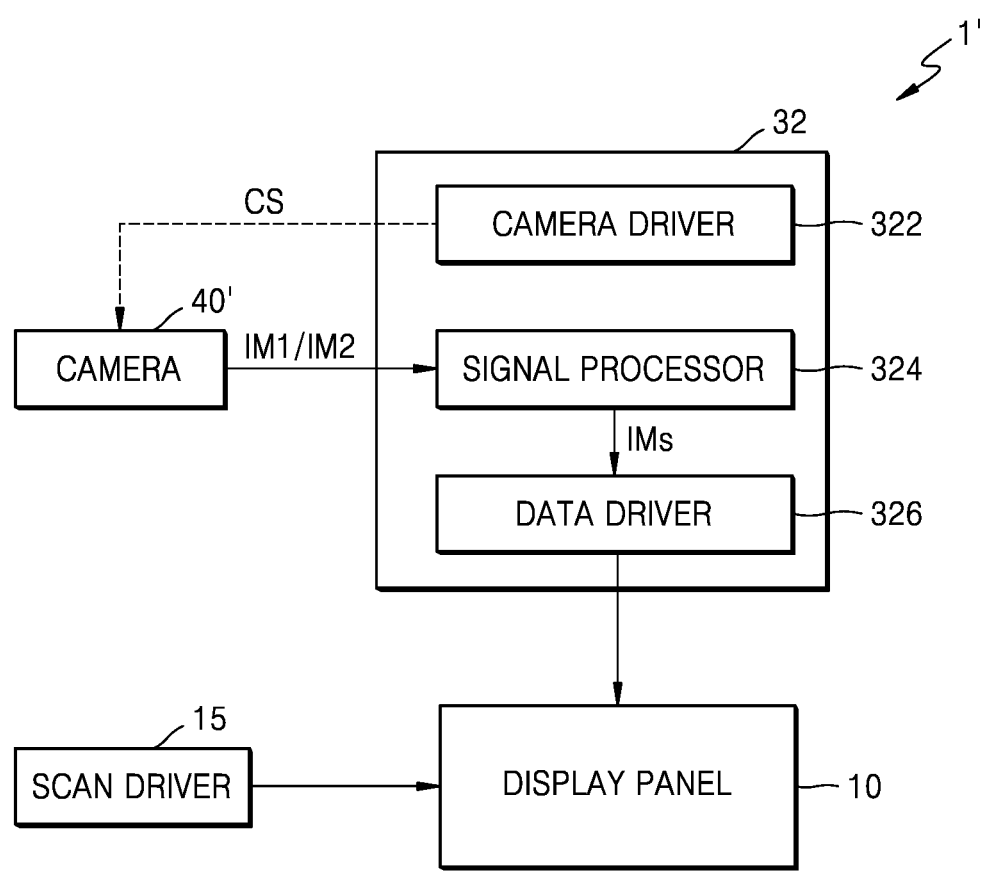
FIGS. 16 and 17 are schematic views of a display device including the display panel of FIG. 15.
Figure 17:
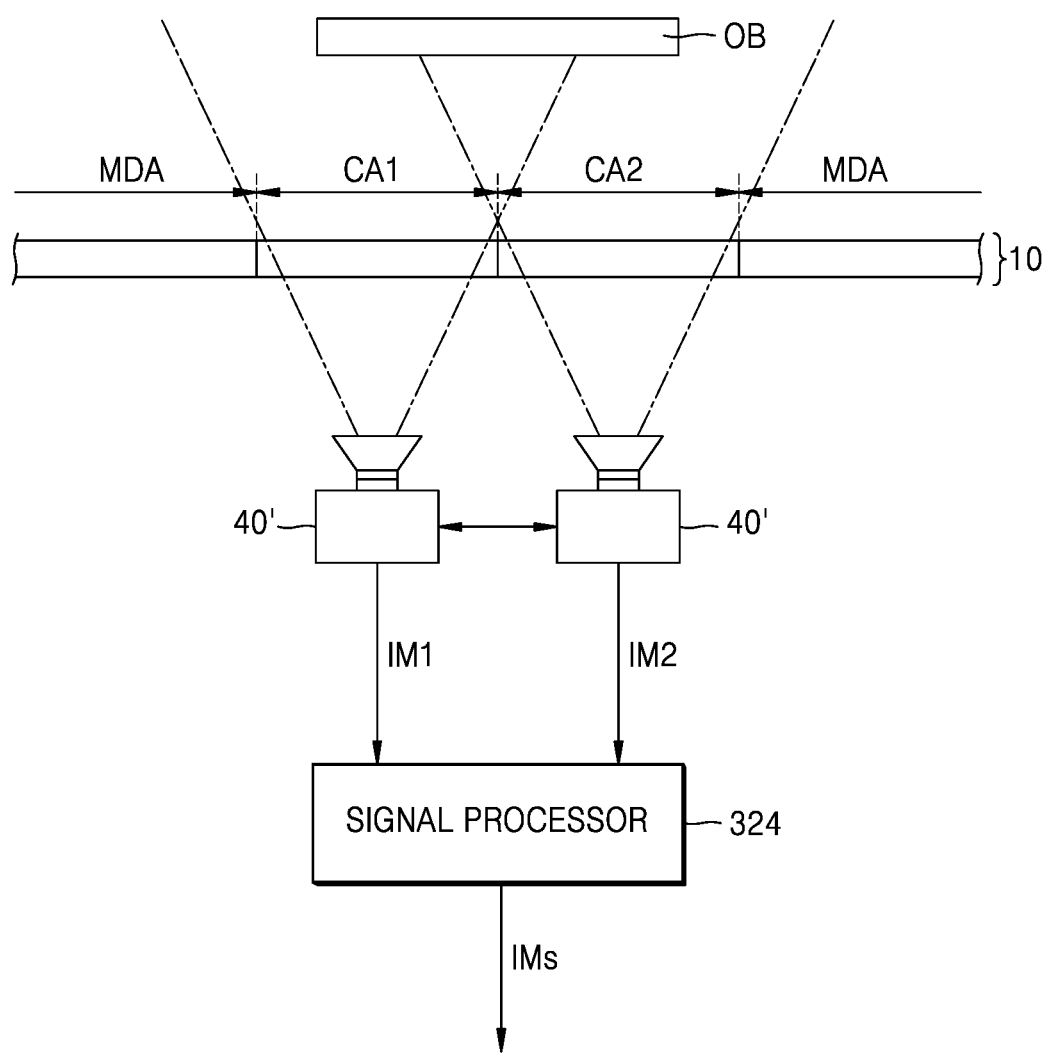

FIG. 15 is a schematic cross-sectional view of a display panel according to embodiments. FIGS. 16 and 17 are schematic views of the display device of FIG. 15.

Referring to FIG. 15, the display device 1 may include the display panel 10 and a component 40 overlapping the display panel 10. The display panel 10 may include the first and second component areas CA1 and CA2, which may be apart from each other, and the main display area MDA. Referring to FIG. 15, the main display area MDA may be disposed between the first component area CA1 and the second component area CA2, but as shown in FIG. 17, the main display area MDA may not be disposed between the first component area CA1 and the second component area CA2 because the first component area CA1 and the second component area CA2 may be formed adjacent to each other. In some embodiments, the transmission area TA may be formed between the first component area CA1 and the second component area CA2.

As shown in FIGS. 16 and 17, the component 40 may be a camera 40' including the image sensor and a module driving the image sensor. Hereinafter, the descriptions which are the same as those provided with reference to FIGS. 10 to 12 will be omitted.

The camera 40' may be moved on an x-y plane with respect to the display panel 10 according to the control signal CS from the camera driver 322. A moving part connected to the camera 40' may be provided in various forms including a device and a structure, for example, a motor and a cylinder, which move the camera 40'.

In the shooting mode, the camera 40' may be moved to the first component area CA1 to capture the scene including the object OB by using the light that is incident to the first component area CA1 and obtain the first image signal IM1, and the camera 40' may be moved to the second component area CA2 to capture the scene including the object OB by using the light that is incident to the second component area CA2 and obtain the second image signal IM2. For example, the camera 40' may obtain the first image signal IM1 and the second image signal IM2 with a time difference.

The signal processor 324 may generate the synthesis image signal IMs that synthesizes the first image signal IM1 and the second image signal IM2. The signal processor 324 may detect the deterioration data of the first image signal IM1 and generate the synthesis image signal IMs by correcting the first image signal IM1 based on the pixel data of the second image signal IM2 corresponding to the deterioration data.

Figure 18:
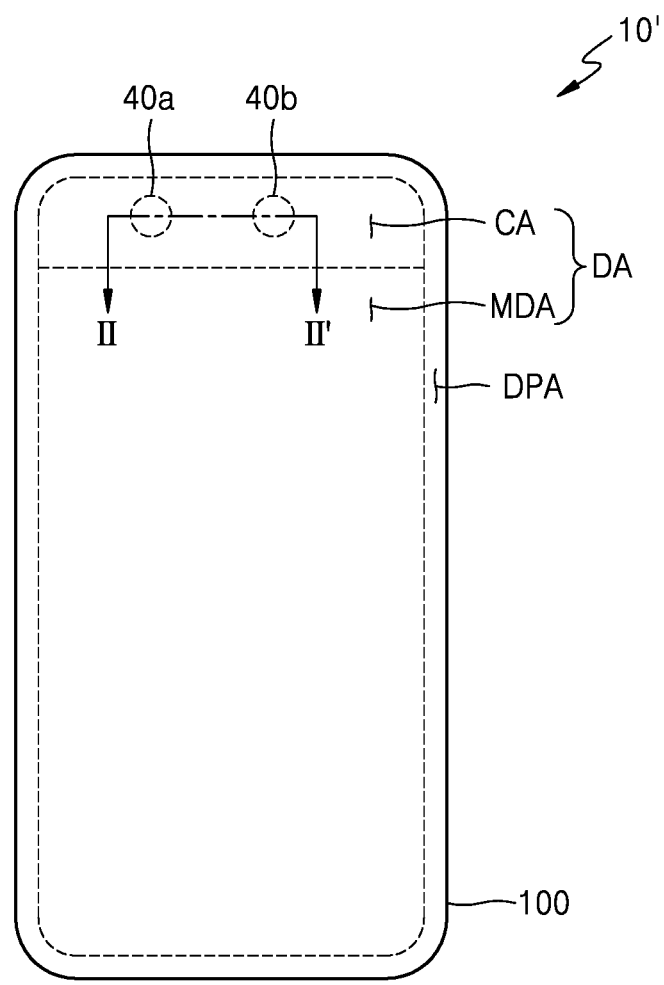
FIGS. 18 and 19 are schematic plan views of a display panel, according to an embodiment.
Figure 19:
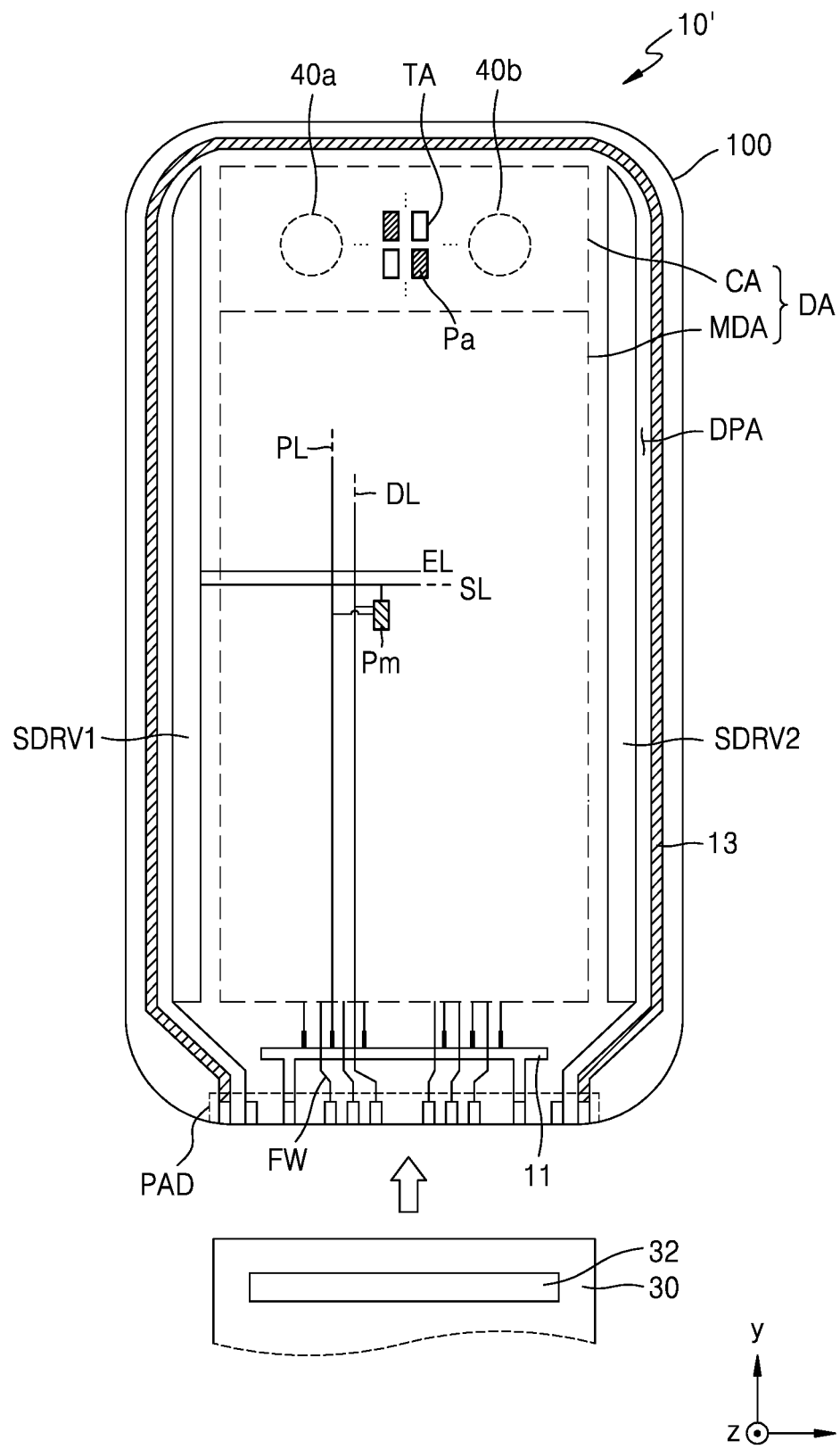
Figure 20:
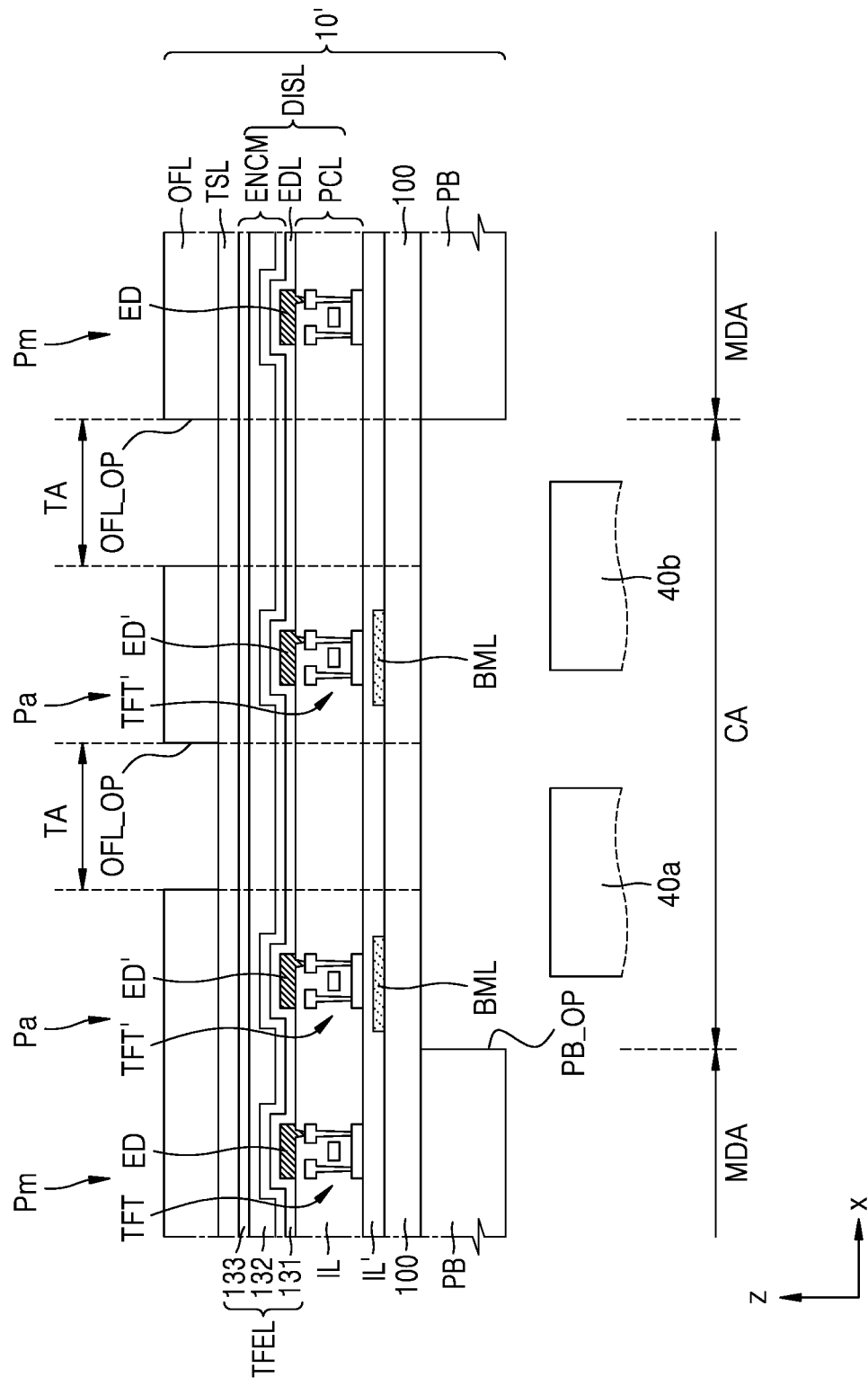
FIG. 20 is a schematic cross-sectional view of a display panel according to embodiments.

FIGS. 18 and 19 are schematic plan views of a display panel, according to an embodiment. FIG. 20 is a schematic cross-sectional view of a display panel according to embodiments and may correspond to a cross-section of the display panel of FIG. 18, taken along line II-II'.

Referring to FIGS. 18 and 19, a display panel 10' according to an embodiment includes the display area DA, where images may be displayed, and the peripheral area DPA where no images may be displayed. The display area DA may include the main display area MDA and the component area CA.

As shown in FIG. 5, in the main display area MDA, the main sub-pixels Pm may be arranged in a Pentile form.

The component area CA may be of a bar type. As shown in FIG. 6 or 13, the auxiliary sub-pixels Pa may be arranged in the component area CA, and the component area CA may include the pixel group PG including at least one auxiliary sub-pixel Pa and the transmission area TA. As shown in FIGS. 7A and 7B and 14A and 14B, the opaque layer BML may be disposed in the component area CA like the second component area CA2. The opaque layer BML may have the lower hole BMLH having a rectangular, "L", or circular shape and corresponding to the transmission area TA.

Corresponding to the component area CA, the first component 40a and the second component 40b may be disposed apart from each other under the component area CA. The first component 40a and the second component 40b may be fixed at designated locations.

Figure 21:
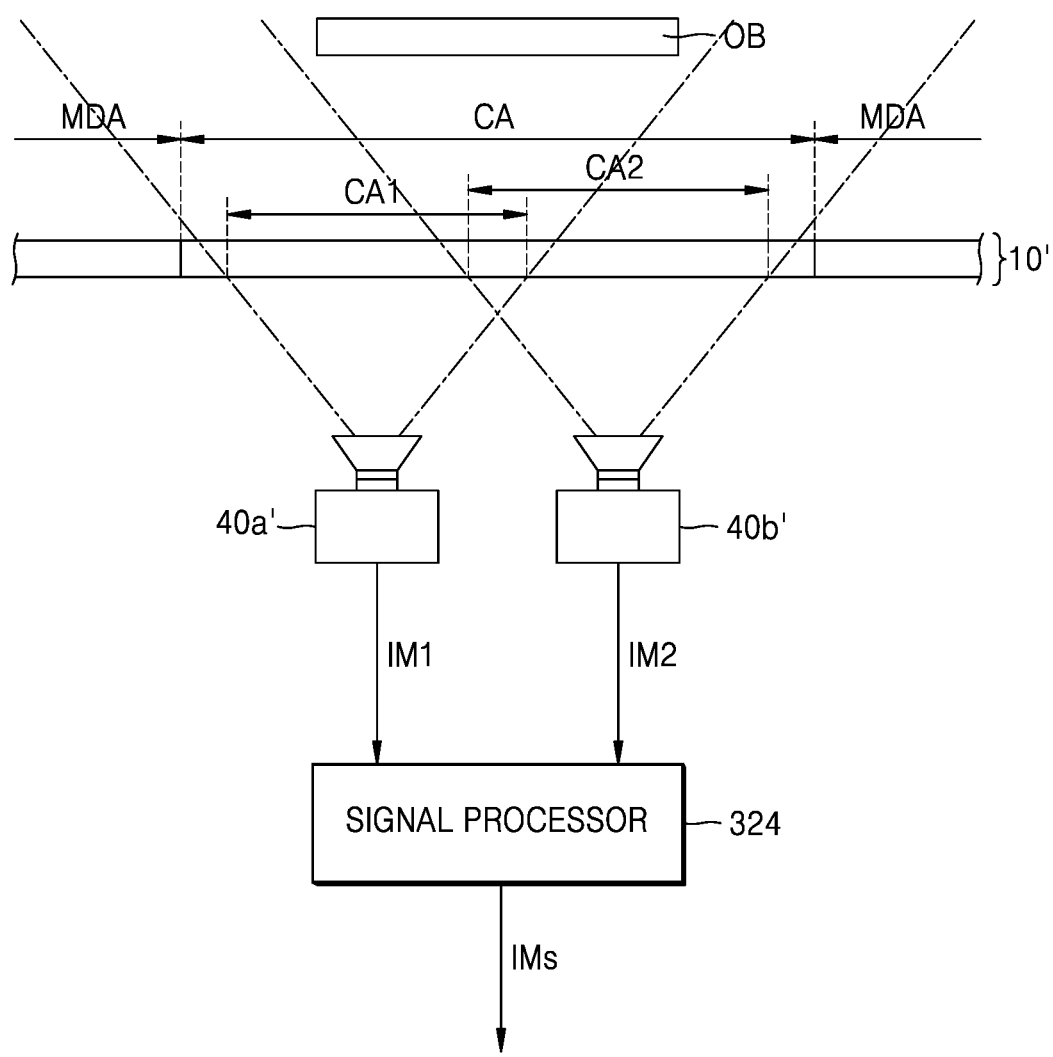
FIGS. 21 and 22 are schematic diagrams showing acquisition of image signals in the display device, according to an embodiment.
Figure 22:
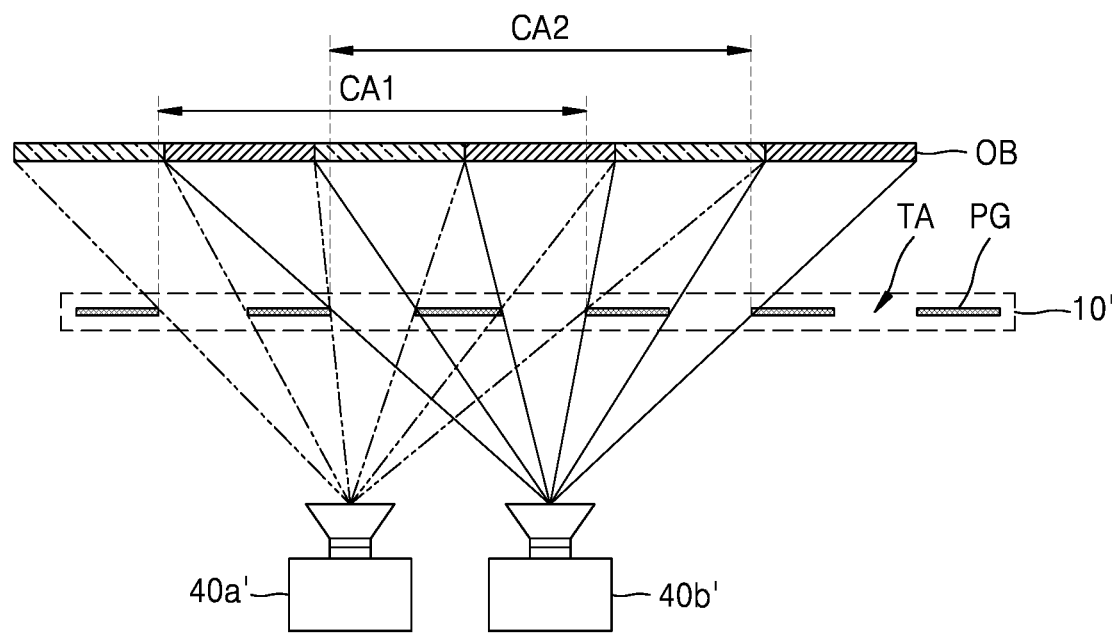
Figure 23:
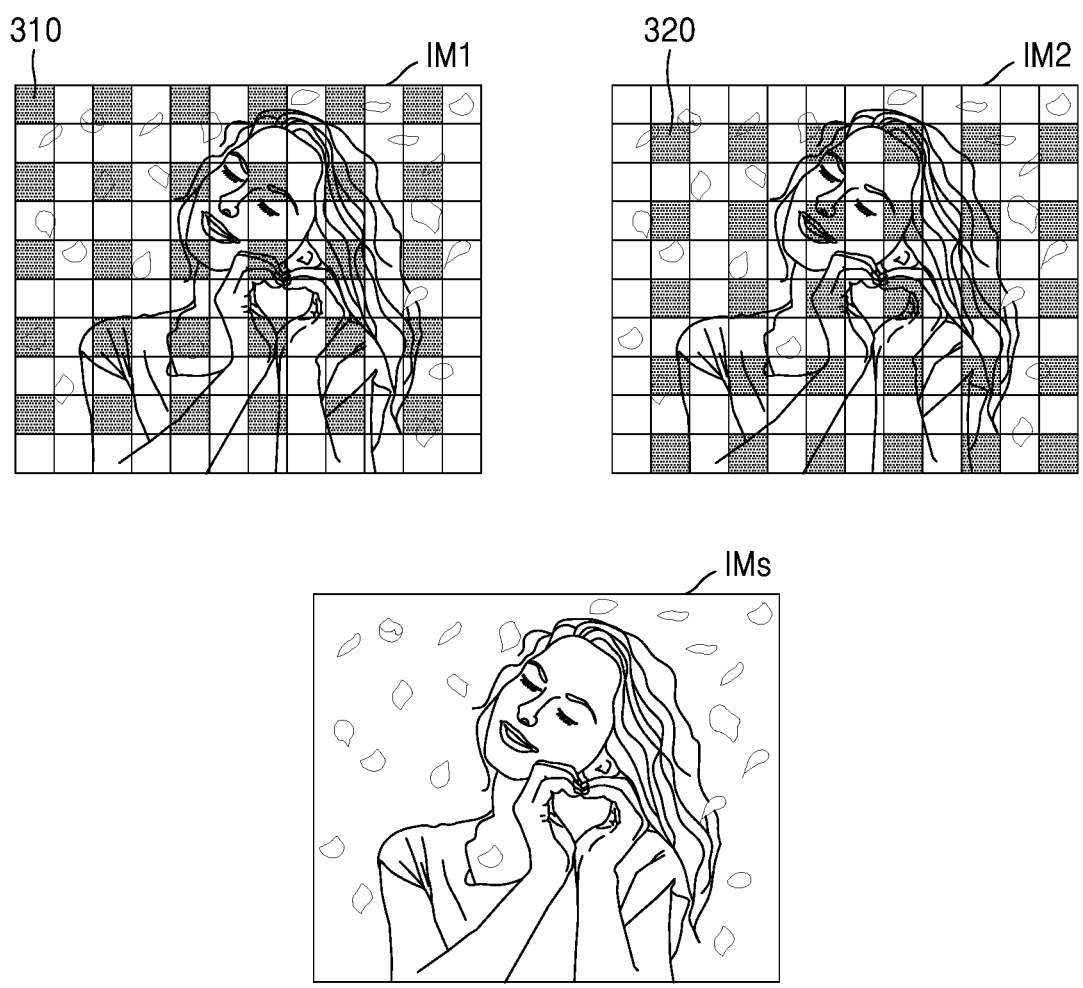
FIG. 23 is a schematic view showing generation of synthesis image signals of a display device, according to an embodiment.

FIGS. 21 and 22 are schematic diagrams showing acquisition of image signals in the display device, according to an embodiment. FIG. 23 is a schematic view showing generation of synthesis image signals, according to an embodiment.

Referring to FIGS. 21 and 22, the display device 1' may include the first camera 40a', which is disposed corresponding to the first component area CA of the display panel 10' as the first component, and the second camera 40b' disposed corresponding to the second component area CA2 as the second component.

The first camera 40a' and the second camera 40b' may be disposed adjacent to each other to face in the same direction and may be embedded in a member of an integral type. The first camera 40a' and the second camera 40b' may be cameras having the same performance. The first camera 40a' and the second camera 40b' may be disposed apart from each other, when the first image signal IM1 and the second image signal IM2 are matched and registrated, not to make a location of a first area (deterioration data) 310 corresponding to a location of the pixel group PG of the first image signal IM1 overlap a location of a second area (deterioration data) 320 corresponding to a location of the pixel group PG of the second image signal IM2.

As shown in FIG. 10, the camera driver 322 may activate the first camera 40a' and the second camera 40b' in the shooting mode and may output the control signals CS used to control the driving of the first camera 40a' and/or the second camera 40b'.

The first camera 40a' and the second camera 40b' may respectively obtain the first image signal IM1 and second image signal IM2 by capturing the scene including the object OB by using light that is incident to the first component area CA1 and the second component area CA2 that are portions of the component area CA. The first component area CA1 included in a field of view of the first camera 40a' and the second component area CA2 included in a field of view of the second camera 40b' may partially overlap.

The signal processor 324 may read the data of each light-receiving pixel of the first image signal IM1 according to coordinates of the light-receiving pixel and may detect the deterioration data. The deterioration data may represent that the brightness value of the coordinates of the light-receiving pixel deviates a range of the reference brightness value. The signal processor 324 may read the data of each light-receiving pixel of the second image signal IM2 according to coordinates of the light-receiving pixel and may detect the deterioration data. The deterioration data may represent that the brightness value of the coordinates of the light-receiving pixel deviates a range of the reference brightness value.

The signal processor 324 may generate the synthesis image signal IMs by synthesizing the pixel data other than the deterioration data of the first image signal IM1, with the pixel data other than the deterioration data of the second image signal IM2. For example, as shown in FIG. 23, the synthesis image signal IMs may be generated by synthesizing the pixel data, other than the deterioration data 310 of the first image signal IM1, with the pixel data, other than the deterioration data 320 of the second image signal IM2. The deterioration data 310 of the first image signal IM1 may be the pixel data of light-receiving pixels disposed corresponding to a location of the pixel group PG of the first image signal IM1. And the deterioration data 320 of the second image signal IM2 may be the pixel data of light-receiving pixels disposed corresponding to a location of the pixel group PG of the second image signal IM2. A location of the deterioration data 310 of the first image signal IM1 and a location of the deterioration data 320 of the second image signal IM2 may be offset and thus may not overlap. Various image signal synthesis methods including the aforementioned methods, for example, replacement with the pixel data of the corresponding coordinates and/or a weighted sum of the pixel data of corresponding coordinates, may be applied.

Figure 24:
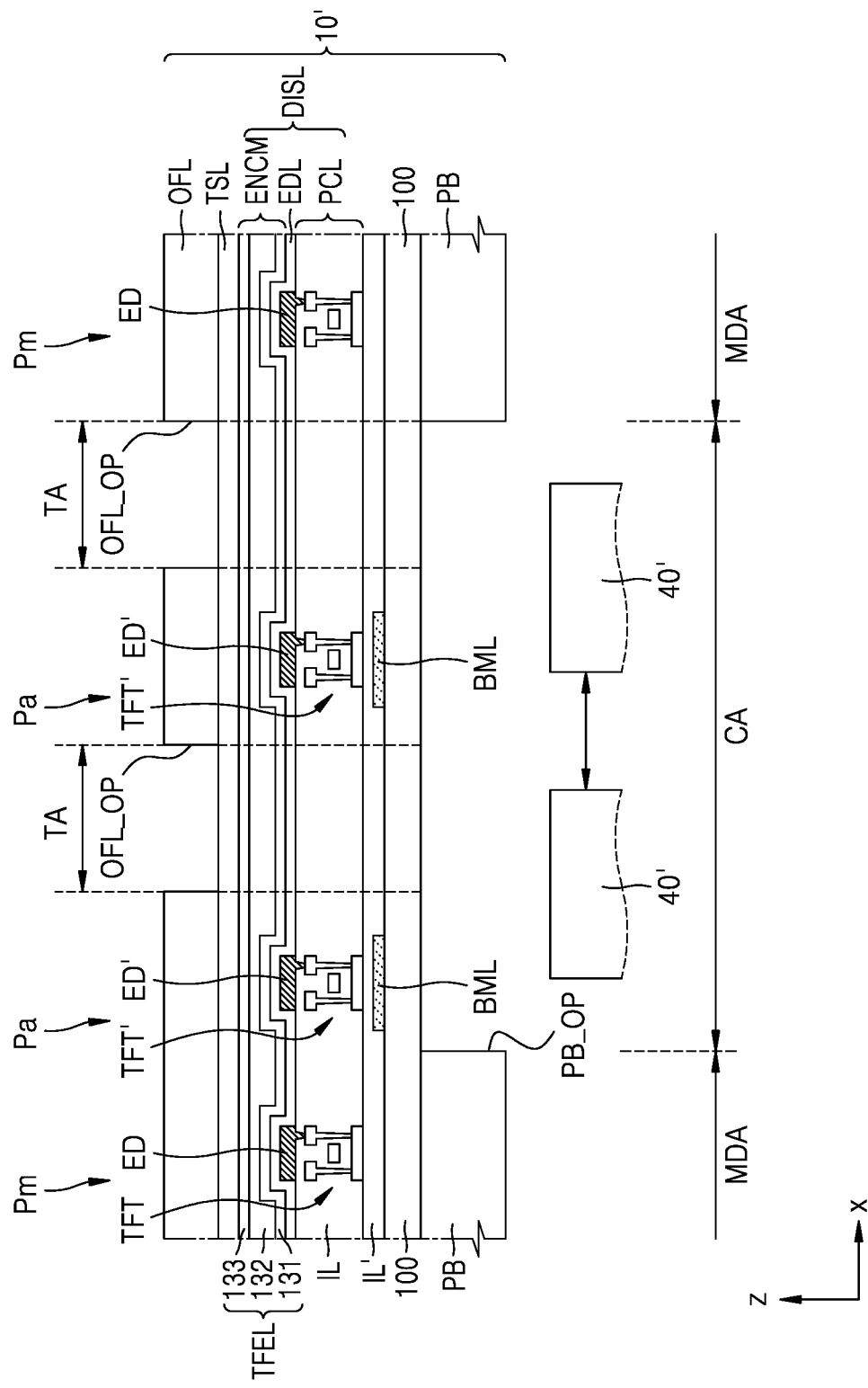
FIG. 24 is a schematic cross-sectional view of a display panel according to an embodiment.

FIG. 24 is a schematic cross-sectional view of a display panel according to an embodiment.

Referring to FIG. 24, the display device 1' may include the display panel 10' and the cameras 40' disposed corresponding to the component area CA of the display panel 10' as a component. The cameras 40' may be moved on an x-y plane with respect to the display panel 10 according to the control signal CS from the camera driver 322.

In the shooting mode, the cameras 40' may be respectively moved to the first and second component areas CA1 and CA2, which are portions of the component area CA, and may obtain the first image signal IM1 by capturing the scene including the object OB by the light incident to the first component area CA1, and the second image signal IM2 by capturing the scene including the object OB by the light incident to the second component area CA2. The first component area CA1 and the second component area CA2 may partially overlap.

As shown in FIG. 23, the location of the camera 40' may be moved, when the first image signal IM1 and the second image signal IM2 are matched and registrated, not to make the location of the first area 310 that corresponds to the location of the pixel group PG of the first image signal IM1, overlap the location of the second area 320 that corresponds to the location of the pixel group PG of the second image signal IM2.

The signal processor 324 may generate the synthesis image signal IMs by synthesizing the pixel data other than the deterioration data of the first image signal IM1, with the pixel data other than the deterioration data of the second image signal IM2. Various synthesis methods including the aforementioned methods, for example, replacement with the pixel data of the corresponding coordinates and/or a weighted sum of the pixel data of corresponding coordinates, may be applied.

The above embodiments relate to the synthesis of two image signals obtained from two component areas, but one or more embodiments are not limited thereto. For example, the method may be applied to synthesis of three or more image signals obtained from three or more component areas. Some of the component areas may overlap each other, and locations of component areas and/or cameras may be set to make locations of deterioration data of image signals be offset, as shown in FIG. 23.

FIGS. 25A to 25E are schematic diagrams showing generation of image signals in a display device, according to an embodiment.

The components 40, 40a, and 40b, and the cameras 40', 40a', and 40b' according to the above embodiments may be moved by as much as pixel pitches in certain directions and thus may obtain the image signals. The movement of the camera may indicate the movement of the image sensor, and the pixel pitch may be a center distance between two adjacent light-receiving pixels of the image sensor. For convenience of explanation, FIGS. 25A to 25E show image signals captured by image sensors IS including first to sixteenth light-receiving pixels 51 to 66 and color filters CF'.

In general, each light-receiving pixel of the image sensor may obtain one of RGB values according to a corresponding color filter and predict three RGB values by interpolating RGB values of neighboring light-receiving pixels. For example, the red pixel R of the image sensor may have an R value and may obtain RGB values by predicting a G value through the interpolation of neighboring green pixels G and a B value through the interpolation of neighboring blue pixels B.

According to an embodiment, RGB values of respective light-receiving pixels may be obtained by moving the image sensor IS by as much as the pixel pitch to capture images and synthesizing the image signals, and thus, a data interpolation operation of neighboring pixels is not required. For example, each of the first image signal IM1 and the second image signal IM2 may be image signal obtained by synthesizing the image signals obtained by moving the image sensor IS, respectively.

Figures 25A, 25B, 25C, 25D, 25E:
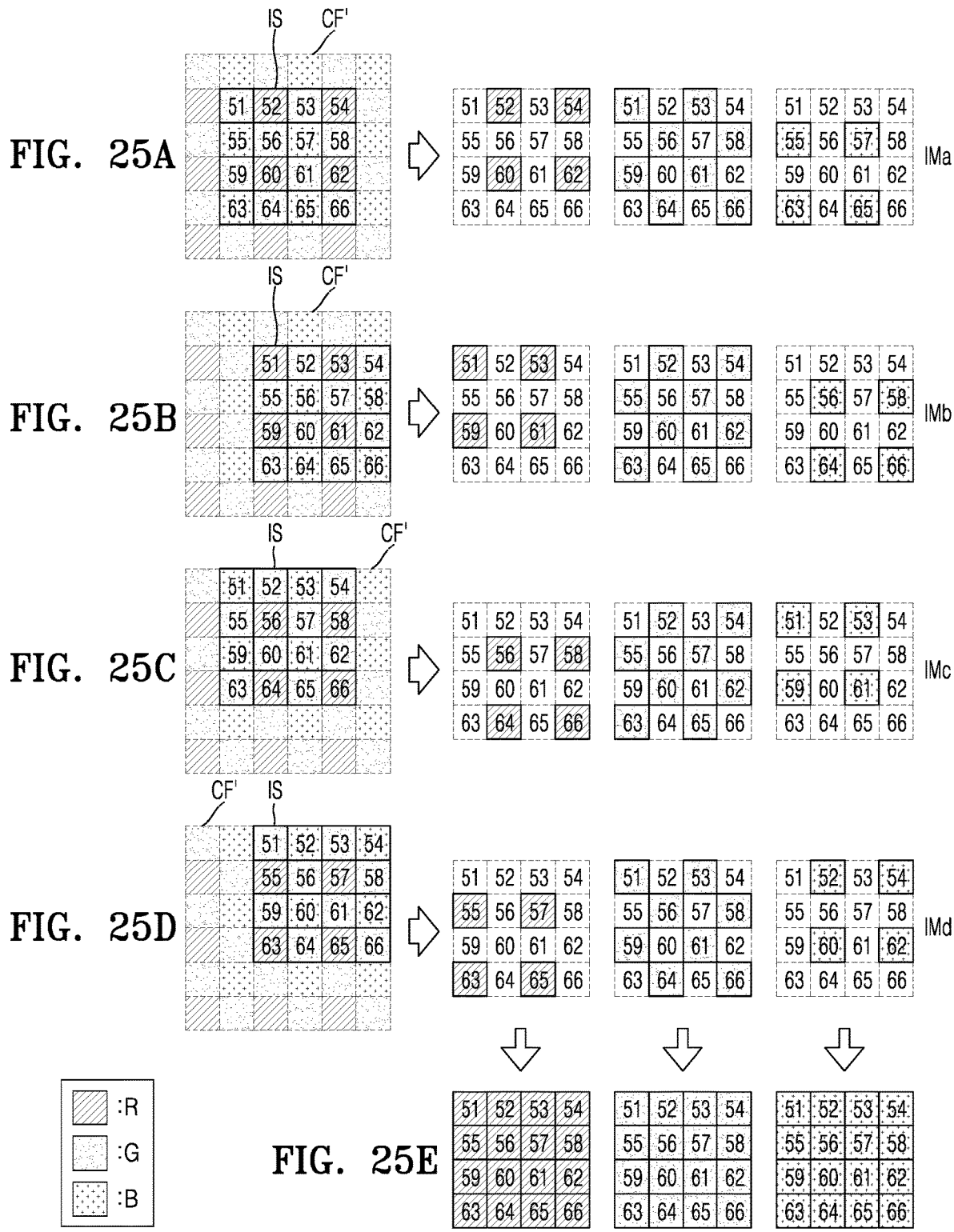
FIGS. 25A to 25E are schematic diagrams showing generation of image signals in a display device, according to an embodiment.

Referring to FIG. 25A, the image sensor IS may capture an image at a first location and may obtain first image signals IMa. The first to sixteenth light-receiving pixels 51 to 66 may respectively have G, R, G, R, B, G, B, G, G, R, G, R, B, G, B, and G values.

Referring to FIG. 25B, the image sensor IS may capture an image at a second location, which is moved rightwards from the first location by as much as a pixel pitch and may obtain second image signals IMb. The first to sixteenth light-receiving pixels 51 to 66 may respectively have R, G, R, G, G, B, G, B, R, G, R, G, G, B, G, and B values.

Referring to FIG. 25C, the image sensor IS may capture an image at a third location, which is moved upwards from the first location by as much as a pixel pitch, and may obtain third image signals IMc. The first to sixteenth light-receiving pixels 51 to 66 may respectively have B, G, B, G, G, R, G, R, B, G, B, G, G, R, G, and R values.

Referring to FIG. 25D, the image sensor IS may capture an image at a fourth location, which is moved rightwards and upwards from the first location by as much as a pixel pitch, and may obtain fourth image signals IMd. The first to sixteenth light-receiving pixels 51 to 66 of the image sensor may respectively have G, B, G, B, R, G, R, G, G, B, G, B, R, G, R, and G values.

As shown in FIG. 25E, by synthesizing the first to fourth image signals IMa, IMb, IMc, and IMd obtained by moving the image sensor IS of the camera, the RGB values of the first to sixteenth light-receiving pixels 51 to 66 may be respectively obtained. According to an embodiment, a high-quality image may be obtained without a complicate interpolation operation through multi-photographing performed by moving the image sensor IS.

Figure 26:
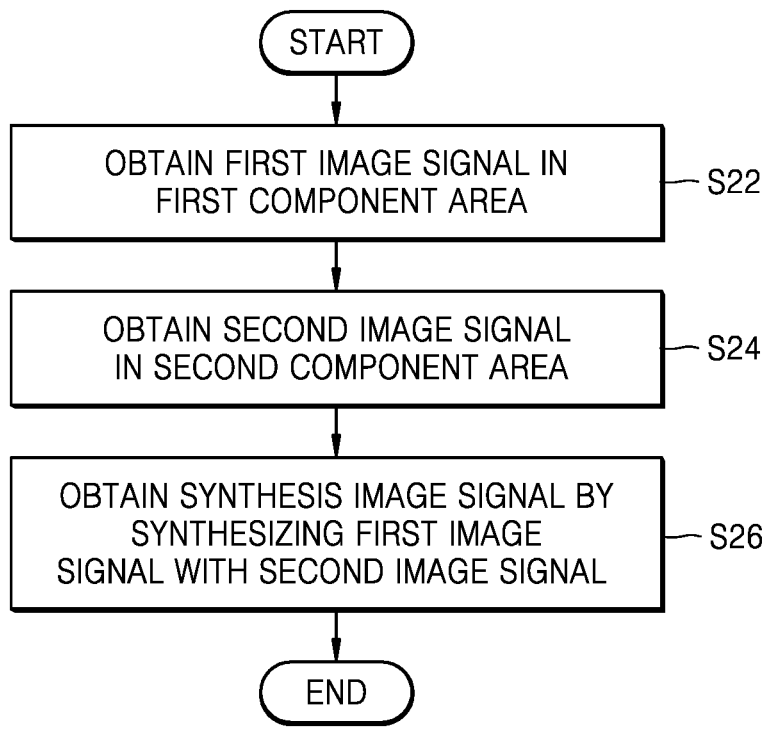
FIG. 26 is a schematic diagram of an image signal generation method of a display device, according to an embodiment.

FIG. 26 is a schematic diagram of an image signal generation method of a display device, according to an embodiment.

FIG. 26 may show a method of processing the images obtained by cameras and/or components of the display devices 1 and 1' including the display panels 10 and 10' and a single one or multiple ones of the components and cameras 40, 40a, 40b, 40', 40a', and 40b'.

The display device may obtain the first image signal from the light-receiving pixels of the image sensor disposed corresponding to the first component area of the display panel (i.e., the display device may obtain the first image signal in the first component area) (S22) and the second image signal from the light-receiving pixels of the image sensor disposed corresponding to the second component area of the display panel (i.e., the display device may obtain the second image signal in the second component area) (S24).

In some embodiments, the first and second component areas of the display panel may be apart from each other. In the first component area or the second component area, the opaque layer may be disposed. As shown in FIG. 11, the first camera, which may include the light-receiving pixels arranged corresponding to the first component area, and the second camera, which may include the light-receiving pixels arranged corresponding to the second component area, may be separate from each other. The performance of the first camera may be the same as or different from that of the second camera. For example, the first camera may be a low-sensitivity camera having a high resolution, and the second camera may be a high-sensitivity camera having a low resolution. As another example, as shown in FIG. 17, one camera including the image sensor may be moved in the first component area and the second component area.

In other embodiments, the first component area and the second component area of the display panel may be portions of one component area. The opaque layer may be disposed in the first component area and the second component area. Portions of the first component area and the second component area may be the same. As shown in FIG. 21, the first camera including the light-receiving pixels arranged corresponding to a first location of the component area, for example, the first component area, and the second camera including the light-receiving pixels arranged corresponding to a second location of the component area, for example, the second component area, may be apart from each other. As another example, as shown in FIG. 24, one camera including the image sensor may be disposed in the component area to be moved in the first component area and the second component area.

The display device may obtain the synthesis image signal by synthesizing the first image signal and the second image signal (S26).

When the first image signal and the second image signal are registrated, the location of the deterioration data of the first image signal and the location of the deterioration data of the second image signal may be offset. For example, the pixel data of the second image signal, which is at the location corresponding to the location of the deterioration data of the first image signal, may be pixel data that does not deteriorate. The deterioration data may be determined according to conditions defined by the user. For example, the deterioration data may be pixel data deviated the reference pixel value range. As another example, the deterioration data may be pixel data of a light-receiving pixel that corresponds to an area other than the transmission area in the component area. For example, the deterioration data may be pixel data of a light-receiving pixel that receives light passing through the area other than the transmission area in the component area.

The display device may obtain the synthesis image signal based on the pixel data excluding the deterioration data of the first image signal and the pixel data excluding the deterioration data of the second image signal. Various methods including the aforementioned methods, for example, replacement with the pixel data of the corresponding coordinates and a weighted sum of the pixel data of corresponding coordinates, may be applied.

The display device may obtain image signals through multi-photographing, during which images are captured by moving the image sensor by as much as a pixel pitch in multiple directions, and may respectively generate the first and second images by synthesizing the image signals.

According to the one or more embodiments of the disclosure, a display panel, of which a display area is expanded to display an image even in an area where a component that is an electronic element is located, and a display device including the display panel may be realized. However, the scope of the disclosure is not limited by the effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, including any equivalents.

What is claimed is:

1. A display device comprising:
a main display area;
a component area comprising a transmission area;
main sub-pixels disposed on a substrate corresponding to the main display area; and
auxiliary sub-pixels disposed on the substrate corresponding to the component area, wherein
the component area comprises a first component area and a second component area, and
auxiliary sub-pixels arranged in the first component area and auxiliary sub-pixels arranged in the second component area have a same arrangement structure; and
an opaque layer disposed between the substrate and the auxiliary sub-pixels in the second component area, the opaque layer being absent from the first component area, the opaque layer including a hole corresponding to the transmission area.

2. The display device of claim 1, wherein the hole of the opaque layer has a circle shape.

3. The display device of claim 1, wherein the opaque layer comprises lightproof metal.

4. The display device of claim 1, wherein the opaque layer comprises a lightproof organic material.

5. The display device of claim 1, further comprising
a first camera disposed under the substrate corresponding to the first component area;
a second camera disposed under the substrate corresponding to the second component area; and
a driver that generates a synthesis image signal by synthesizing a first image signal from the first camera and a second image signal from the second camera.

6. The display device of claim 5, wherein
the first camera includes a low-sensitivity camera having a high resolution, and
the second camera includes a high-sensitivity camera having a low resolution.

7. The display device of claim 5, wherein the driver generates the synthesis image signal by replacing deterioration data of the first image signal with pixel data of a corresponding location in the second image signal, the deterioration data being a brightness value that deviates from a reference brightness value range.

8. The display device of claim 5, wherein the driver generates the synthesis image signal by synthesizing pixel data corresponding to a foreground of the first image signal and pixel data corresponding to a background of the second image signal.

9. The display device of claim 5, wherein the driver:
generates the first image signal by synthesizing a plurality of image signals obtained by moving an image sensor of the first camera by as much as a pixel pitch in multiple directions, and
generates the second image signal by synthesizing a plurality of image signals obtained by moving an image sensor of the second camera by as much as a pixel pitch in multiple directions.

10. The display device of claim 1, further comprising:
a camera disposed under the substrate corresponding to the component area; and
a driver that generates a synthesis image signal by synthesizing a first image signal which is obtained by moving the camera towards the first component area, and a second image signal which is obtained by moving the camera towards the second component area.

11. The display device of claim 10, wherein the driver generates the synthesis image signal by replacing deterioration data of the first image signal with pixel data of a corresponding location in the second image signal, the deterioration data being a brightness value that deviates from a reference brightness value range.

12. The display device of claim 10, wherein the driver generates the synthesis image signal by synthesizing pixel data corresponding to a foreground of the first image signal and pixel data corresponding to a background of the second image signal.

13. The display device of claim 10, wherein the driver:
generates the first image signal by synthesizing a plurality of image signals obtained by moving an image sensor of the camera by as much as a pixel pitch in multiple directions, and
generates the second image signal by synthesizing a plurality of image signals obtained by moving the image sensor of the camera by as much as a pixel pitch in multiple directions.

14. The display device of claim 1, wherein
pixel groups are disposed in the component area, each of the pixel groups including a predetermined number of the auxiliary sub-pixels, and
the transmission area is located around the pixel groups.

15. The display device of claim 1, wherein
each of the main sub-pixels and the auxiliary sub-pixels comprises a pixel electrode and an emission layer, and
an opposite electrode is disposed above the pixel electrode, the opposite electrode being common to the main sub-pixels and the auxiliary sub-pixels and comprising a through hole corresponding to the transmission area.

16. The display device of claim 1, wherein the second component area is spaced apart from the first component area.

17. The display device of claim 1, wherein a plurality of the main sub-pixels are disposed between the first component area and the second component area.

18. The display device of claim 1, wherein the transmission area is absent of any of the auxiliary sub-pixels and is absent of any of the main sub-pixels.

* * * * *